(12) United States Patent
Tanaka et al.

(10) Patent No.: US 11,374,122 B2
(45) Date of Patent: Jun. 28, 2022

(54) SEMICONDUCTOR DEVICE, INVERTER CIRCUIT, DRIVE DEVICE, VEHICLE, AND ELEVATING MACHINE

(71) Applicant: KABUSHIKI KAISHA TOSHIBA, Tokyo (JP)

(72) Inventors: Katsuhisa Tanaka, Himeji Hyogo (JP); Ryosuke Iijima, Setagaya Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 16/996,963

(22) Filed: Aug. 19, 2020

(65) Prior Publication Data

US 2021/0184030 A1 Jun. 17, 2021

(30) Foreign Application Priority Data

Dec. 11, 2019 (JP) .............................. JP2019-223645

(51) Int. Cl.
*H01L 29/78* (2006.01)
*H01L 29/16* (2006.01)
(Continued)

(52) U.S. Cl.
CPC ........ *H01L 29/7811* (2013.01); *H01L 21/049* (2013.01); *H01L 21/0465* (2013.01);
(Continued)

(58) Field of Classification Search
CPC ............. H01L 29/7811; H01L 21/0465; H01L 21/049; H01L 21/761; H01L 29/0623;
(Continued)

(56) References Cited

U.S. PATENT DOCUMENTS

2012/0267681 A1* 10/2012 Nemoto .............. H01L 29/1004
257/139
2013/0140582 A1 6/2013 Kawakami et al.
(Continued)

FOREIGN PATENT DOCUMENTS

JP 2014-38937 A 2/2014
JP 5554415 B2 7/2014
(Continued)

*Primary Examiner* — Cuong B Nguyen
(74) *Attorney, Agent, or Firm* — Finnegan, Henderson, Farabow, Garrett & Dunner L.L.P.

(57) ABSTRACT

A semiconductor device of an embodiment includes an element region and a termination region surrounding the element region. The element region includes a gate trench, a first silicon carbide region of n-type, a second silicon carbide region of p-type on the first silicon carbide region, a third silicon carbide region of n-type on the second silicon carbide region, and a fourth silicon carbide region of p-type sandwiches the first silicon carbide region and the second silicon carbide region with the gate trench, the fourth silicon carbide region being deeper than the gate trench. The termination region includes a first trench surrounding the element region, and a fifth silicon carbide region of p-type between the first trench and the first silicon carbide region, the fifth silicon carbide region same or shallower than the fourth silicon carbide region. The semiconductor device includes a gate electrode, a first electrode, and a second electrode.

18 Claims, 38 Drawing Sheets

(51) Int. Cl.
*H01L 29/06* (2006.01)
*H01L 29/10* (2006.01)
*H01L 29/66* (2006.01)
*H01L 21/761* (2006.01)
*H01L 21/04* (2006.01)
*H02P 27/06* (2006.01)
*B66B 11/04* (2006.01)
*B60L 50/51* (2019.01)
*B61C 3/00* (2006.01)

(52) U.S. Cl.
CPC ........ *H01L 21/761* (2013.01); *H01L 29/0623* (2013.01); *H01L 29/1095* (2013.01); *H01L 29/1608* (2013.01); *H01L 29/66068* (2013.01); *H01L 29/7813* (2013.01); *B60L 50/51* (2019.02); *B60L 2210/42* (2013.01); *B61C 3/00* (2013.01); *B66B 11/043* (2013.01); *H02P 27/06* (2013.01)

(58) Field of Classification Search
CPC ............. H01L 29/1095; H01L 29/1608; H01L 29/66068; H01L 29/7813; H01L 21/7602; H01L 29/0615; H01L 29/0619; H01L 29/0649; H01L 29/0661; H01L 29/0878; H01L 29/41766; B60L 50/51; B60L 2210/42; B61C 3/00; B66B 11/043; B66B 1/30; H02P 27/06
See application file for complete search history.

(56) References Cited

U.S. PATENT DOCUMENTS

| | | | |
|---|---|---|---|
| 2015/0333190 | A1 | 11/2015 | Aketa et al. |
| 2017/0084735 | A1* | 3/2017 | Takeuchi ............ H01L 21/8213 |
| 2018/0040688 | A1 | 2/2018 | Kobayashi et al. |
| 2019/0386094 | A1 | 12/2019 | Takeuchi et al. |

FOREIGN PATENT DOCUMENTS

| | | | |
|---|---|---|---|
| JP | 5745954 | B2 | 7/2015 |
| JP | 5999678 | B2 | 9/2016 |
| JP | 6112600 | B2 | 4/2017 |
| JP | 2018-6631 | A | 1/2018 |
| JP | 2018-22851 | A | 2/2018 |

* cited by examiner

SEMICONDUCTOR DEVICE, INVERTER CIRCUIT, DRIVE DEVICE, VEHICLE, AND ELEVATING MACHINE

CROSS-REFERENCE TO RELATED APPLICATION

This application is based upon and claims the benefit of priority from Japanese Patent Application No. 2019-223645, filed on Dec. 11, 2019, the entire contents of which are incorporated herein by reference.

FIELD

Embodiments described herein relate generally to a semiconductor device, an inverter circuit, a drive device, a vehicle, and an elevating machine.

BACKGROUND

Silicon carbide (SiC) is expected as a material for next-generation semiconductor devices. Silicon carbide has excellent physical properties as compared to silicon, such as a band gap of about 3 times, a breakdown field strength of about 10 times, and a thermal conductivity of about 3 times that of silicon. By utilizing the physical properties, it is possible to achieve a semiconductor device that can operate at high temperature with low loss.

In a vertical metal oxide semiconductor field effect transistor (MOSFET), a trench gate structure in which a gate electrode is provided in a trench is applied in order to achieve low on-resistance. By applying the trench gate structure, the channel area per unit area is increased and the on-resistance is reduced.

In a MOSFET having a trench gate structure, an electric field relaxation region deeper than the trench may be provided on the sides of the trench in order to improve the reliability of a gate insulating layer at the bottom of the trench. In this case, the electric fields may be concentrated in the electric field relaxation regions at the ends of the element region, and the breakdown voltage of the MOSFET may be reduced. Therefore, even when the electric field relaxation regions are provided, it is desired to provide a termination structure that improves the breakdown voltage of the MOSFET around the element region.

DETAILED DESCRIPTION

Figure 1:
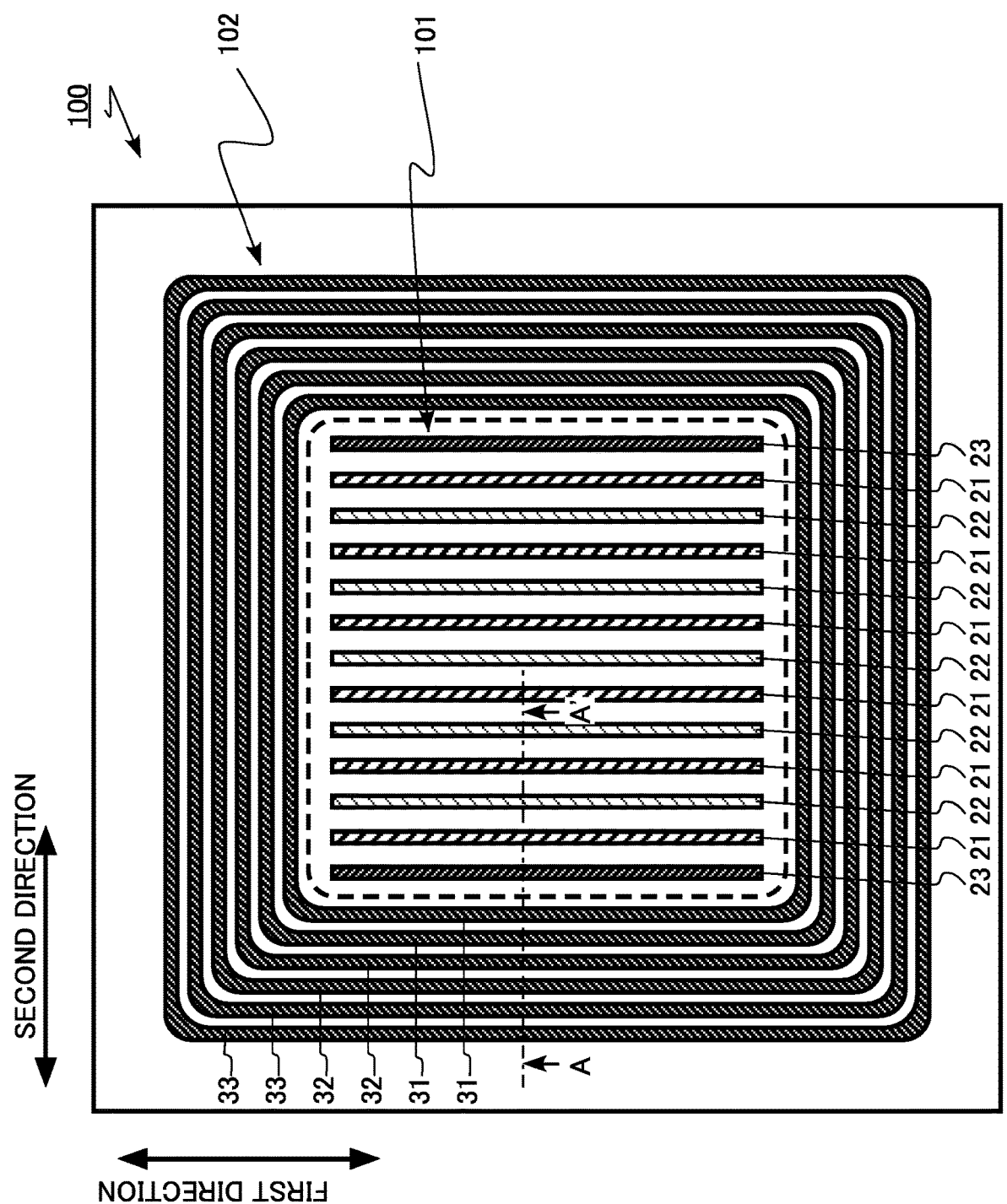
FIG. 1 is a schematic plan view of a semiconductor device according to a first embodiment.

According to an embodiment, there is provided a semiconductor device including: a silicon carbide layer having a first face and a second face, the silicon carbide layer including an element region and a termination region surrounding the element region, the element region including: a gate trench disposed on a side of the first face; a first silicon carbide region of n-type; a second silicon carbide region of p-type disposed between the first silicon carbide region and the first face; a third silicon carbide region of n-type disposed between the second silicon carbide region and the first face; and a fourth silicon carbide region of p-type, the first silicon carbide region interposed between the fourth silicon carbide region and the gate trench, the second silicon carbide region interposed between the fourth silicon carbide region and the gate trench, a distance between the second face and the fourth silicon carbide region being smaller than a distance between the second face and the gate trench, the termination region including: a first trench disposed on the side of the first face and surrounding the element region; the first silicon carbide region; and a fifth silicon carbide region of p-type, at least a part of the fifth silicon carbide region being disposed between the first silicon carbide region and the first trench, a distance between the second face and the fifth silicon carbide region being the same as or larger than the distance between the second face and the fourth silicon carbide region, and the fifth silicon carbide region having a p-type impurity concentration lower than a p-type impurity concentration of the fourth silicon carbide region; a gate electrode disposed in the gate trench; a gate insulating layer disposed between the gate electrode and the silicon carbide layer; a first electrode disposed on the side of the first face of the silicon carbide layer and electrically connected to the second silicon carbide region, the third silicon carbide region, the fourth silicon carbide region and the fifth silicon carbide region; and a second electrode disposed on a side of the second face of the silicon carbide layer.

Hereinafter, embodiments of the present disclosure will be described with reference to the drawings. In the following description, the same or similar members and the like will be denoted by the same reference numerals, and the description of the members and the like once described will be appropriately omitted.

Further, in the following description, when the notations of $n^+$, $n$, $n^-$, $p^+$, $p$, $p^-$, and $p^{--}$ are used, these notations represent the relative level of the impurity concentration in each conductivity type. That is, $n^+$ has a relatively higher n-type impurity concentration than n, and $n^-$ has a relatively lower n-type impurity concentration than n. Further, $p^+$ has a relatively higher p-type impurity concentration than p, $p^-$ has a relatively lower p-type impurity concentration than p, and $p^{--}$ has a relatively lower p-type impurity concentration than $p^-$. In some cases, $n^+$-type and $n^-$-type are simply referred to as n-type, $p^+$-type, $p^-$-type, and $p^{--}$-type are simply referred to as p-type.

The impurity concentration can be measured by, for example, secondary ion mass spectrometry (SIMS). Further, the relative level of the impurity concentration can be obtained from the level of the carrier concentration required by scanning capacitance microscopy (SCM), for example. Further, the distance such as the width and depth of the impurity region can be obtained by SIMS, for example. Also, the distance such as the width and depth of the impurity region can be obtained from an SCM image, for example.

The depth of the trench, the thickness of the insulating layer, and the like can be measured, for example, on a transmission electron microscope (TEM) image. Further, for example, those can be determined from the SIMS profile.

In the present specification, the "p-type impurity concentration" of a p-type silicon carbide region means a net p-type impurity concentration obtained by subtracting the n-type impurity concentration of the region from the p-type impurity concentration of the region. The "n-type impurity concentration" of a silicon carbide region of n-type means a net n-type impurity concentration obtained by subtracting the p-type impurity concentration of the region from the n-type impurity concentration of the region.

First Embodiment

According to a first embodiment, there is provided a semiconductor device including: a silicon carbide layer having a first face and a second face, the silicon carbide layer including an element region and a termination region surrounding the element region, the element region including: a gate trench disposed on a side of the first face; a first silicon carbide region of n-type; a second silicon carbide region of p-type disposed between the first silicon carbide region and the first face; a third silicon carbide region of n-type disposed between the second silicon carbide region and the first face; and a fourth silicon carbide region of p-type that sandwiches the first silicon carbide region and the second silicon carbide region with the gate trench, a distance between the second face and the fourth silicon carbide region of p-type being smaller than a distance between the second face and the gate trench, the termination region including: a first trench disposed on the side of the first face and surrounding the element region; the first silicon carbide region; and a fifth silicon carbide region of p-type, at least a part of the fifth silicon carbide region of p-type being disposed between the first silicon carbide region and the first trench, a distance between the second face and the fifth silicon carbide region of p-type being the same as or larger than a distance between the second face and the fourth silicon carbide region, and the fifth silicon carbide region of p-type having a p-type impurity concentration lower than a p-type impurity concentration of the fourth silicon carbide region; a gate electrode disposed in the gate trench; a gate insulating layer disposed between the gate electrode and the silicon carbide layer; a first electrode disposed on the side of the first face of the silicon carbide layer and electrically connected to the second silicon carbide region, the third silicon carbide region, and the fourth silicon carbide region; and a second electrode disposed on a side of the second face of the silicon carbide layer.

The semiconductor device according to the first embodiment is a vertical MOSFET 100 that uses silicon carbide. The MOSFET 100 is a MOSFET having a trench gate structure in which a gate electrode is provided in a trench. The MOSFET 100 is a MOSFET having a so-called double trench structure in which a source electrode is provided in a trench. Further, the MOSFET 100 is an n-channel MOSFET that uses electrons as carriers.

Figure 2:
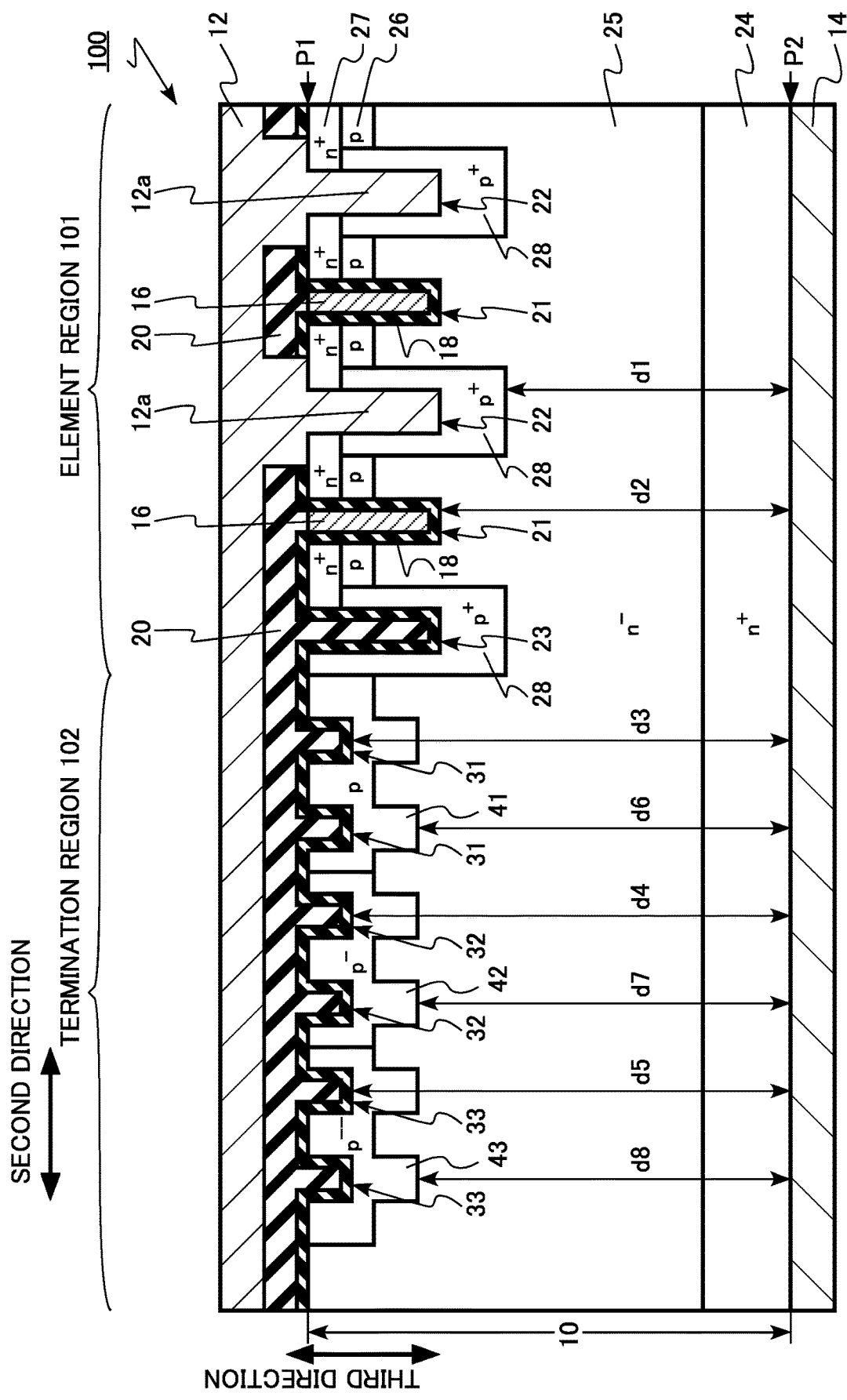
FIG. 2 is an enlarged schematic sectional view of the semiconductor device according to the first embodiment.
Figure 3:
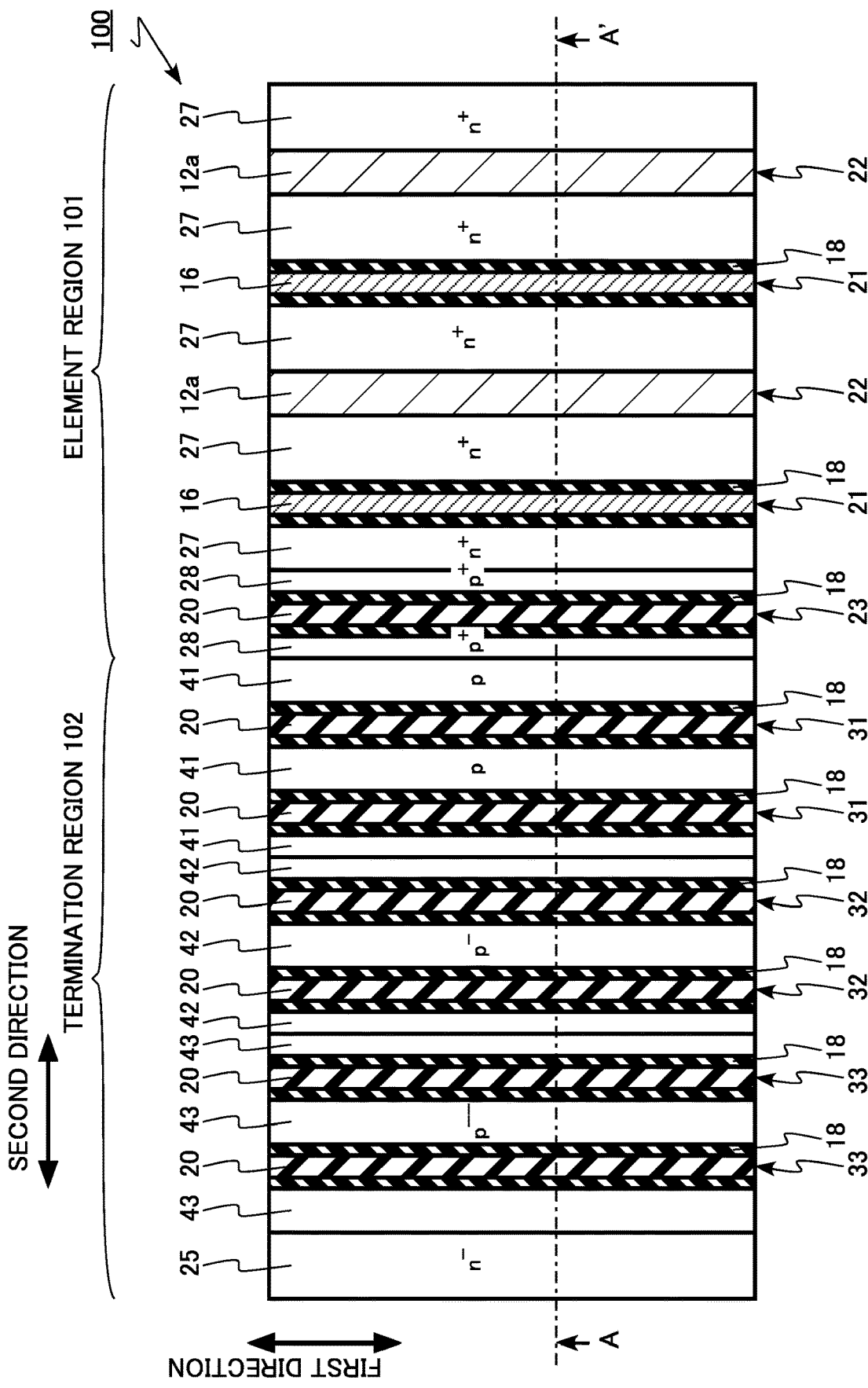
FIG. 3 is an enlarged schematic plan view of the semiconductor device according to the first embodiment.

FIG. 1 is a schematic plan view of the semiconductor device according to the first embodiment. FIG. 2 is an enlarged schematic sectional view of the semiconductor device according to the first embodiment. FIG. 3 is an enlarged schematic plan view of the semiconductor device according to the first embodiment.

FIG. 2 is a sectional view taken along the line A-A' of FIGS. 1 and 3. FIG. 3 shows a pattern on a first face P1 of FIG. 2.

As shown in FIG. 1, the MOSFET 100 includes an element region 101 and a termination region 102. The element region 101 is a region surrounded by a broken line in FIG. 1. The termination region 102 surrounds the element region 101.

The element region 101 functions as a region in which current mainly flows when the MOSFET 100 is in an ON state. The termination region 102 functions as a region that relaxes the strength of an electric field applied to the end of the element region 101 and improves the breakdown voltage of the MOSFET 100 when the MOSFET 100 is in an off state.

The MOSFET 100 includes a silicon carbide layer 10, a source electrode 12 (first electrode), a drain electrode 14 (second electrode), gate electrodes 16, gate insulating layers 18, and interlayer insulating layers 20. The source electrode 12 includes first contact regions 12a.

The silicon carbide layer 10 includes gate trenches 21, contact trenches 22, dummy trenches 23, an n$^+$-type drain region 24, an n$^-$-type drift region 25 (first silicon carbide region), a p-type body region 26 (second Silicon carbide region), an n$^+$-type source region 27 (third silicon carbide region), p$^+$-type electric field relaxation regions 28 (fourth silicon carbide regions), first termination trenches 31 (first trenches), second termination trenches 32 (second trenches), third termination trenches 33 (third trenches), a first p-type region of p-type 41 (fifth silicon carbide region), a second p-type region of p$^-$-type 42 (sixth silicon carbide region), and a third p-type region of p$^{--}$-type 43 (seventh silicon carbide region).

In the silicon carbide layer 10 of the element region 101, the gate trenches 21, the contact trenches 22, the dummy trenches 23, the n$^+$-type drain region 24, the n$^-$-type drift region 25 (first silicon carbide region), the p-type body region 26 (second Silicon carbide region), the n$^+$-type source region 27 (third silicon carbide region), and the p$^+$-type electric field relaxation regions 28 (fourth silicon carbide region) are provided.

In the silicon carbide layer 10 of the termination region 102, the n$^+$-type drain region 24, the n$^-$-type drift region 25 (first silicon carbide region), the first termination trenches 31 (first trenches), the second termination trenches 32 (second trenches), the third termination trenches 33 (third trenches), the first p-type region of p-type 41 (fifth silicon carbide region), the second p-type region of p$^-$-type 42 (sixth silicon carbide region), and the third p-type region of p$^{--}$-type 43 (seventh silicon carbide region) are provided.

The silicon carbide layer 10 is disposed between the source electrode 12 and the drain electrode 14. The silicon carbide layer 10 has the first face ("P1" in FIG. 1) and a second face ("P2" in FIG. 1). Hereinafter, the first face P1 is also referred to as a front face and the second face P2 is also referred to as a back face. The second face P2 faces the first face P1.

The first direction and the second direction are parallel to the first face P1. Further, the second direction is a direction orthogonal to the first direction. Further, the third direction is a direction perpendicular to the first face. The third direction is a direction perpendicular to the first direction and the second direction.

Hereinafter, the "depth" means the depth in the direction toward the second face P2 from the first face P1 as a reference.

The silicon carbide layer 10 is single crystal SiC. The silicon carbide layer 10 is, for example, 4H-SiC. The thickness of the silicon carbide layer 10 is, for example, 5 μm or more and 500 μm or less.

The first face P1 is, for example, a face inclined at from 0 degree to 8 degrees with respect to the (0001) plane. That is, the first face P1 is a face whose normal line is inclined at from 0 degree to 8 degrees with respect to the c-axis in the [0001] direction. In other words, the off angle with respect to the (0001) plane is 0 degrees or more and 8 degrees or less. The second face P2 is, for example, a face inclined at from 0 degree to 8 degrees with respect to the (000-1) plane.

The (0001) plane is called a silicon face. The (000-1) plane is called a carbon face. The inclination direction of the first face P1 and the second face P2 is, for example, the [11-20] direction. The [11-20] direction is the a-axis direction. In FIGS. 2 and 3, for example, the first direction or the second direction shown in the drawings is the a-axis direction.

The gate trenches 21 are present in the silicon carbide layer 10 in the element region 101. The gate trenches 21 are disposed on the side of the first face P1 of the silicon carbide layer 10. The gate trenches 21 are grooves formed in the silicon carbide layer 10.

The gate trenches 21 extend in the first direction as shown in FIGS. 1 and 3. The gate trenches 21 have a stripe shape as shown in FIGS. 1 and 3.

The gate trenches 21 are repeatedly arranged in the second direction as shown in FIGS. 1, 2 and 3. The depth of the gate trenches 21 is, for example, 1 μm or more and 2 μm or less. The width of the gate trenches 21 in the second direction is, for example, 0.5 μm or more and 1 μm or less.

The gate trenches 21 penetrate the source region 27 and the body region 26.

The contact trenches 22 are present in the silicon carbide layer 10 in the element region 101. The contact trenches 22 are disposed on the side of the first face P1 of the silicon carbide layer 10. The contact trenches 22 are grooves formed in the silicon carbide layer 10.

The contact trenches 22 extend in the first direction as shown in FIGS. 1 and 3. The contact trenches 22 have a stripe shape as shown in FIGS. 1 and 3.

The contact trenches 22 are repeatedly arranged in the second direction as shown in FIGS. 1, 2 and 3, and the depth of the contact trenches 22 is, for example, 1 μm or more and 2 μm or less. The width of contact trenches 22 in the second direction is, for example, 0.5 μm or more and 1 μm or less.

The contact trenches 22 penetrate the source region 27 and the body region 26.

The contact trenches 22 are each provided between the two gate trenches 21. The contact trenches 22 are each provided adjacent to the gate trenches 21. The width of the contact trenches 22 in the second direction and the width of the gate trenches 21 in the second direction are, for example, the same.

The depth of the contact trenches 22 and the depth of the gate trenches 21 are, for example, the same. In other words, the distance from the second face P2 to the gate trench 21 (d2 in FIG. 2) and the distance from the second face P2 to the contact trench 22 are the same.

The dummy trenches 23 are present in the silicon carbide layer 10 in the element region 101. The dummy trenches 23 are disposed on the side of the first face P1 of the silicon carbide layer 10. The dummy trenches 23 are grooves formed in the silicon carbide layer 10.

The dummy trenches 23 extend in the first direction as shown in FIGS. 1 and 3. The dummy trenches 23 have a stripe shape as shown in FIGS. 1 and 3.

The dummy trenches 23 are disposed at the ends of the element region 101. The dummy trenches 23 are each provided near the boundary between the element region 101 and the termination region 102.

The depth of the dummy trenches 23 is, for example, 1 μm or more and 2 μm or less. The width of the dummy trenches 23 in the second direction is, for example, 0.5 μm or more and 1 μm or less.

The dummy trenches 23 penetrate the source region 27 and the body region 26.

The width of the dummy trenches 23 in the second direction and widths of the gate trenches 21 and the contact trenches 22 in the second direction are, for example, the same.

The depth of the dummy trenches 23 and the depths of the gate trenches 21 and the contact trenches 22 are, for example, the same. In other words, the distance from the second face P2 to the gate trench 21 (d2 in FIG. 2) and the distance from the second face P2 to the dummy trench 23 are the same. The distance from the second face P2 to the contact trench 22 and the distance from the second face P2 to the dummy trench 23 are the same.

The dummy trench 23 is filled with the interlayer insulating layer 20. By not providing the source electrode 12 in the dummy trench 23, the degree of freedom in arranging the source electrode 12 is increased.

The gate electrodes 16 are each disposed in the gate trench 21. The gate electrodes 16 are provided between the source electrode 12 and the drain electrode 14. The gate electrodes 16 extend in the first direction.

The gate electrode 16 is a conductive layer. The gate electrode 16 is, for example, polycrystalline silicon containing p-type impurities or n-type impurities.

The gate insulating layer 18 is disposed between the gate electrode 16 and the silicon carbide layer 10. The gate insulating layer 18 is provided between the source region 27, the body region 26, and the drift region 25, and the gate electrode 16.

The gate insulating layer 18 is, for example, a silicon oxide film. For example, a high dielectric constant insulating film can be applied to the gate insulating layer 18. Further, for example, a stacked film of a silicon oxide film and a high dielectric constant insulating film can be applied to the gate insulating layer 18.

The interlayer insulating layers 20 are provided on the first face P1 side of the silicon carbide layer 10. The interlayer insulating layer 20 is provided, for example, on the gate electrode 16. The interlayer insulating layer 20 is provided, for example, between the gate electrode 16 and the source electrode 12.

The thickness of the interlayer insulating layer 20 is thicker than that of the gate insulating layer 18, for example. The interlayer insulating layer 20 is, for example, a silicon oxide film or a silicon nitride film. The interlayer insulating layer 20 electrically separates the gate electrode 16 and the source electrode 12.

The source electrode 12 is disposed on the first face P1 side of the silicon carbide layer 10. The source electrode 12 is provided on first face P1 of the silicon carbide layer 10. The source electrode 12 is in contact with the source region 27 and the electric field relaxation regions 28.

The source electrode 12 is electrically connected to the body region 26, the source region 27, and the electric field relaxation regions 28.

The source electrode 12 is in contact with the source region 27 on the first face P1 of the silicon carbide layer 10.

The first contact region 12a, which is a part of the source electrode 12, is provided in the contact trench 22. The first contact region 12a is in contact with the source region 27 on the side faces of the contact trench 22. The first contact region 12a is in contact with the electric field relaxation region 28 on the side faces and the bottom face of the contact trench 22.

The source electrode 12 contains a metal. The metal forming the source electrode 12 has, for example, a stacked structure of titanium (Ti) and aluminum (Al). The source electrode 12 may contain, for example, metal silicide or metal carbide in contact with the silicon carbide layer 10.

The drain electrode 14 is disposed on the second face P2 side of the silicon carbide layer 10. The drain electrode 14 is provided on the second face P2 of the silicon carbide layer 10. The drain electrode 14 is in contact with the drain region 24.

The drain electrode 14 is electrically connected to the drain region 24.

The drain electrode 14 is, for example, a metal or a metal semiconductor compound. The drain electrode 14 contains, for example, a material selected from the group consisting of nickel silicide (NiSi), titanium (Ti), nickel (Ni), silver (Ag), and gold (Au).

The $n^+$-type drain region 24 is provided on the second face P2 side of the silicon carbide layer 10. The drain region 24 contains, for example, nitrogen (N) as an n-type impurity. The n-type impurity concentration of the drain region 24 is, for example, $1\times10^{18}$ cm$^{-3}$ or more and $1\times10^{21}$ cm$^{-3}$ or less.

The $n^-$-type drift region 25 is provided on the drain region 24. The drift region 25 is disposed between the first face P1 and the drain region 24.

The drift region 25 contains, for example, nitrogen (N) as an n-type impurity. The n-type impurity concentration of the drift region 25 is lower than the n-type impurity concentration of the drain region 24. The n-type impurity concentration of the drift region 25 is, for example, $4\times10^{14}$ cm$^{-3}$ or more and $1\times10^{18}$ cm$^{-3}$ or less.

The p-type body region 26 is disposed between the drift region 25 and the first face P1. The body region 26 is disposed between the gate trench 21 and the contact trench 22.

The body region 26 functions as channel formation regions of the MOSFET 100. For example, when the MOSFET 100 is turned on, channels in which electrons flow are formed in regions of the body region 26 in contact with the gate insulating layers 18. The regions of the body region 26 in contact with the gate insulating layers 18 become the channel forming regions.

The body region 26 contains, for example, aluminum (Al) as a p-type impurity. The p-type impurity concentration of the body region 26 is, for example, $5 \times 10^{16}$ cm$^{-3}$ or more and $5 \times 10^{17}$ cm$^{-3}$ or less.

The depth of the body region 26 is smaller than the depth of the gate trench 21. The depth of the body region 26 is, for example, 0.4 µm or more and 1.0 µm or less.

The thickness of the body region 26 in the depth direction (third direction) is, for example, 0.1 µm or more and 0.3 µm or less.

The n$^+$-type source region 27 is disposed between the body region 26 and the first face P1. The source region 27 is disposed between the gate trench 21 and the contact trench 22.

The source region 27 is in contact with the source electrode 12. The source region 27 is in contact with the gate insulating layers 18.

The source region 27 contains, for example, phosphorus (P) as an n-type impurity. The n-type impurity concentration of the source region 27 is higher than the n-type impurity concentration of the drift region 25. The n-type impurity concentration of the source region 27 is, for example, $1 \times 10^{19}$ cm$^{-3}$ or more and $1 \times 10^{21}$ cm$^{-3}$ or less.

The depth of the source region 27 is smaller than the depth of the body region 26. The depth of the source region 27 is, for example, 0.1 µm or more and 0.4 µm or less.

The p$^+$-type electric field relaxation region 28 is disposed between the contact trench 22 and the drift region 25. The electric field relaxation region 28 sandwiches the drift region 25 and the body region 26 with the gate trench 21. The drift region 25 and the body region 26 is disposed between the electric field relaxation region 28 and the gate trench 21. The electric field relaxation region 28 is disposed between the contact trench 22 and the drift region 25. The electric field relaxation region 28 is in contact with the bottom face of the contact trench 22. The electric field relaxation region 28 is in contact with the first contact region 12a of the source electrode 12.

The electric field relaxation region 28 is disposed between the contact trench 22 and the body region 26. The electric field relaxation region 28 is in contact with the side faces of the contact trench 22. The distance (d1 in FIG. 2) between the second face P2 and the electric field relaxation region 28 is smaller than the distance (d2 in FIG. 2) between the second face P2 and the gate trench 21. The depth of the electric field relaxation region 28 is larger than the depth of the gate trench 21.

The electric field relaxation region 28 has a function of relaxing the electric field applied to the gate insulating layer 18 when the MOSFET 100 is turned off. The electric field relaxation regions 28 are electrically connected to the source electrode 12. The electric field relaxation regions 28 are fixed at the same electric potential as the source electrode 12, for example.

The electric field relaxation region 28 contains, for example, aluminum (Al) as a p-type impurity. The p-type impurity concentration of the electric field relaxation region 28 is higher than the p-type impurity concentration of the body region 26. The p-type impurity concentration of the electric field relaxation region 28 is, for example, 10 times or more the p-type impurity concentration of the body region 26. The p-type impurity concentration of the electric field relaxation region 28 is, for example, $5 \times 10^{17}$ cm$^{-3}$ or more and $5 \times 10^{20}$ cm$^{-3}$ or less.

The first termination trenches 31 are present in the silicon carbide layer 10 in the termination region 102. The first termination trenches 31 are disposed on the side of the first face P1 of the silicon carbide layer 10. The first termination trenches 31 are grooves formed in the silicon carbide layer 10.

The first termination trenches 31 surround the element region 101 as shown in FIG. 1. The first termination trenches 31 have an annular shape as shown in FIG. 1.

A plurality of first termination trenches 31 are provided. For example, two first termination trenches 31 are provided as shown in FIG. 1. One first termination trench 31 is provided around the other first termination trench 31.

The depth of the first termination trenches 31 is, for example, 0.2 µm or more and 2 µm or less. The width of the first termination trenches 31 in the second direction is, for example, 0.5 µm or more and 1 µm or less.

The distance (d3 in FIG. 2) between the second face P2 and the first termination trench 31 is smaller than the distance (d2 in FIG. 2) between the second face P2 and the gate trench 21, for example. The depth of the first termination trenches 31 is smaller than the depth of the gate trenches 21, for example.

The distance (d3 in FIG. 2) between the second face P2 and the first termination trench 31 is smaller than the distance between the second face P2 and the contact trench 22, for example. The depth of the first termination trenches 31 is smaller than the depth of the contact trenches 22, for example.

The distance (d3 in FIG. 2) between the second face P2 and the first termination trench 31 is smaller than the distance between the second face P2 and the dummy trench 23, for example. The depth of the first termination trenches 31 is smaller than the depth of the dummy trenches 23, for example.

The depth of the first termination trenches 31 is half or less of the depths of the gate trenches 21, the contact trenches 22, and the dummy trenches 23, for example.

The second termination trenches 32 are present in the silicon carbide layer 10 in the termination region 102. The second termination trenches 32 are disposed on the side of the first face P1 of the silicon carbide layer 10. The second termination trenches 32 are grooves formed in the silicon carbide layer 10.

The second termination trenches 32 surround the first termination trenches 31 as shown in FIG. 1. The second termination trenches 32 have an annular shape as shown in FIG. 1.

A plurality of second termination trenches 32 are provided. For example, two second termination trenches 32 are provided as shown in FIG. 1. One second termination trench 32 is provided around the other second termination trench 32.

The depth of the second termination trenches 32 is, for example, 0.2 µm or more and 2 µm or less. The width of the second termination trenches 32 in the second direction is, for example, 0.5 µm or more and 1 µm or less.

The distance (d4 in FIG. 2) between the second face P2 and the second termination trench 32 is the same as or smaller than the distance (d3 in FIG. 2) between the second face P2 and the first termination trench 31, for example. The distance (d4 in FIG. 2) between the second face P2 and the second termination trench 32 and the distance (d3 in FIG. 2) between the second face P2 and the first termination trench 31 are, for example, the same. The depth of the second termination trenches 32 and the depth of the first termination trenches 31 are, for example, the same.

The depth of the second termination trenches 32 is half or less of the depths of the gate trenches 21, the contact trenches 22, and the dummy trenches 23, for example.

The third termination trenches 33 are present in the silicon carbide layer 10 in the termination region 102. The third termination trenches 33 are disposed on the side of the first face P1 of the silicon carbide layer 10. The third termination trenches 33 are grooves formed in the silicon carbide layer 10.

The third termination trenches 33 surround the second termination trenches 32 as shown in FIG. 1. The third termination trenches 33 have an annular shape as shown in FIG. 1.

A plurality of third termination trenches 33 are provided. For example, two third termination trenches 33 are provided as shown in FIG. 1. One third termination trench 33 is provided around the other third termination trench 33.

The depth of the third termination trenches 33 is, for example, 0.2 μm or more and 2 μm or less. The width of the third termination trenches 33 in the second direction is, for example, 0.5 μm or more and 1 μm or less.

The distance (d5 in FIG. 2) between the second face P2 and the third termination trench 33 is the same as or smaller than the distance (d3 in FIG. 2) between the second face P2 and the first termination trench 31, for example. The distance (d5 in FIG. 2) between the second face P2 and the third termination trench 33 and the distance (d3 in FIG. 2) between the second face P2 and the first termination trench 31 are, for example, the same. The depth of the third termination trenches 33 is, for example, the same as the depth of the first termination trenches 31 and the depth of the second termination trenches 32.

The depth of the third termination trenches 33 is half or less of the depths of the gate trenches 21, the contact trenches 22, and the dummy trenches 23, for example.

The first p-type region of p-type 41 is provided on the first face P1 side of the silicon carbide layer 10. At least a part of the p-type region 41 is provided between the drift region 25 and the first termination trench 31. The first p-type region 41 is also provided between the first termination trenches 31.

The first p-type region 41 is in contact with the electric field relaxation region 28. The first p-type region 41 is electrically connected to the source electrode 12.

The distance (d6 in FIG. 2) between the second face P2 and the first p-type region 41 is the same as or larger than the distance (d1 in FIG. 2) between the second face P2 and the electric field relaxation region 28. The depth of the first p-type region 41 is the same as or smaller than the depth of the electric field relaxation region 28. The depth of the first p-type region 41 is larger than the depth of the body region 26, for example.

The p-type impurity concentration of the first p-type region 41 is lower than the p-type impurity concentration of the electric field relaxation region 28. Further, the p-type impurity concentration of the first p-type region 41 is higher than the p-type impurity concentration of the body region 26, for example.

The first p-type region 41 contains, for example, aluminum (Al) as a p-type impurity. The p-type impurity concentration of the first p-type region 41 is, for example, $5\times10^{16}$ $cm^{-3}$ or more and $1\times10^{18}$ $cm^{-3}$ or less.

The second p-type region of p⁻-type 42 is provided on the first face P1 side of the silicon carbide layer 10. At least a part of the second p-type region 42 is provided between the drift region 25 and the second termination trench 32. The second p-type region 42 is also provided between the second termination trenches 32.

The second p-type region 42 is in contact with the first p-type region 41. The second p-type region 42 is electrically connected to the source electrode 12.

The distance (d7 in FIG. 2) between the second face P2 and the second p-type region 42 is the same as or larger than the distance (d1 in FIG. 2) between the second face P2 and the electric field relaxation region 28. The depth of the second p-type region 42 is the same as or smaller than the depth of the electric field relaxation region 28. The depth of the second p-type region 42 is larger than the depth of the body region 26, for example. The depth of the second p-type region 42 is the same as the depth of the first p-type region 41, for example.

The p-type impurity concentration of the second p-type region 42 is lower than the p-type impurity concentration of the electric field relaxation region 28. Further, the p-type impurity concentration of the second p-type region 42 is lower than the p-type impurity concentration of the first p-type region 41.

The second p-type region 42 contains, for example, aluminum (Al) as a p-type impurity. The p-type impurity concentration of the second p-type region 42 is, for example, $1\times10^{16}$ $cm^{-3}$ or more and $1\times10^{18}$ $cm^{-3}$ or less.

The third p-type region of p⁻⁻-type 43 is provided on the first face P1 side of the silicon carbide layer 10. At least a part of the third p-type region 43 is provided between the drift region 25 and the third termination trench 33. The third p-type region 43 is also provided between the third termination trenches 33.

The third p-type region 43 is in contact with the second p-type region 42. The third p-type region 43 is electrically connected to the source electrode 12.

The distance (d8 in FIG. 2) between the second face P2 and the third p-type region 43 is the same as or larger than the distance (d1 in FIG. 2) between the second face P2 and the electric field relaxation region 28. The depth of the third p-type region 43 is the same as or smaller than the depth of the electric field relaxation region 28. The depth of the third p-type region 43 is larger than the depth of the body region 26, for example. The depth of the third p-type region 43 is, for example, the same as the depth of the first p-type region 41 and the depth of the second p-type region 42.

The p-type impurity concentration of the third p-type region 43 is lower than the p-type impurity concentration of the electric field relaxation region 28. Further, the p-type impurity concentration of the third p-type region 43 is lower than the p-type impurity concentration of the first p-type region 41. Further, the p-type impurity concentration of the third p-type region 43 is lower than the p-type impurity concentration of the second p-type region 42.

The third p-type region 43 contains, for example, aluminum (Al) as a p-type impurity. The p-type impurity concentration of the third p-type region 43 is, for example, $5\times10^{15}$ $cm^{-3}$ or more and $5\times10^{17}$ $cm^{-3}$ or less.

Next, an example of a method of manufacturing the semiconductor device according to the first embodiment will be described.

FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, FIG. 26, FIG. 27, FIG. 28, and FIG. 29 are schematic sectional views showing an example of the method of manufacturing the semiconductor device according to the first embodiment. FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG.

21, FIG. 22, FIG. 23, FIG. 24, FIG. 25, FIG. 26, FIG. 27, FIG. 28, and FIG. 29 show cross sections corresponding to FIG. 2.

Figure 4:
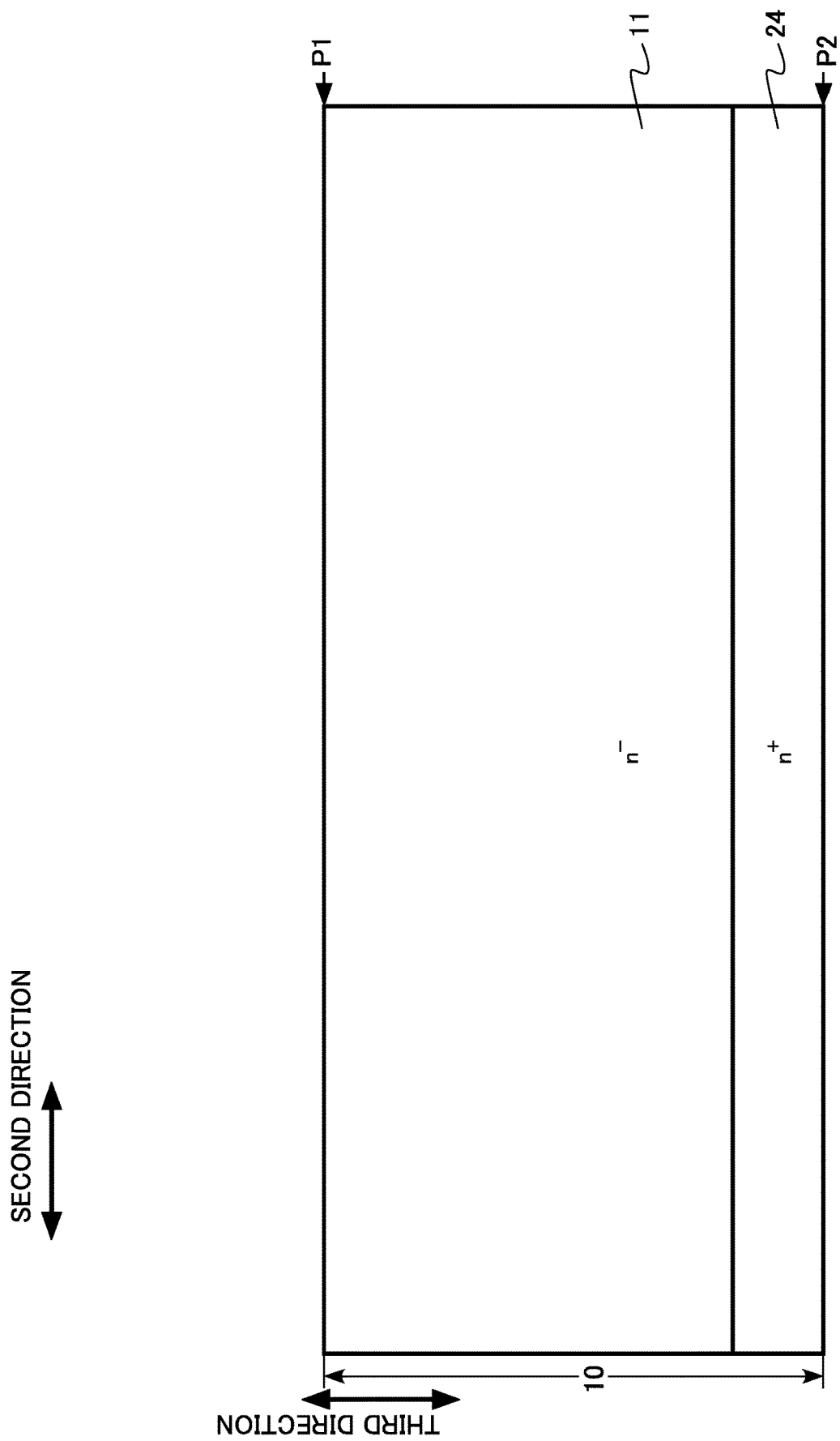
FIG. 4 is a schematic sectional view showing an example of a method of manufacturing the semiconductor device according to the first embodiment.

First, the silicon carbide layer 10 including the n$^+$-type drain region 24 and an n$^-$-type epitaxial layer 11 formed on the drain region 24 by epitaxial growth is prepared (FIG. 4). A part of the epitaxial layer 11 finally becomes the drift region 25.

The silicon carbide layer 10 has the first face ("P1" in FIG. 4) and the second face ("P2" in FIG. 4). Hereinafter, the first face P1 is also referred to as a front face and the second face P2 is also referred to as a back face.

Figure 5:
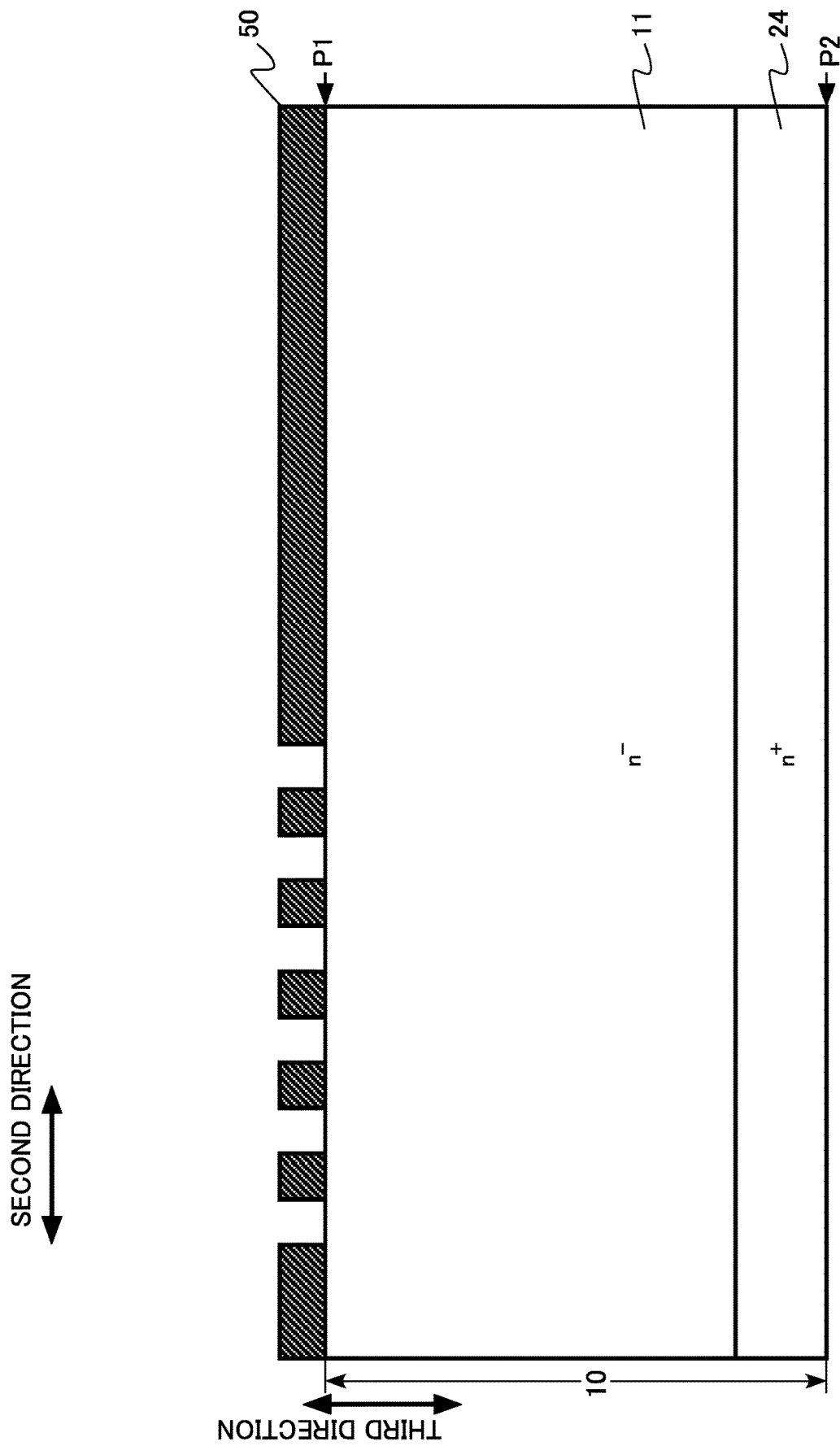
FIG. 5 is a schematic sectional view showing the example of the method of manufacturing the semiconductor device according to the first embodiment.

Next, a mask material 50 is formed on the epitaxial layer 11 (FIG. 5). The mask material 50 has an opening. The mask material 50 is formed by, for example, deposition of a film by a chemical vapor deposition method (CVD method), a lithography method, and patterning of the film by using a reactive ion etching method (RIE method). The mask material 50 is, for example, a silicon oxide film.

Figure 6:
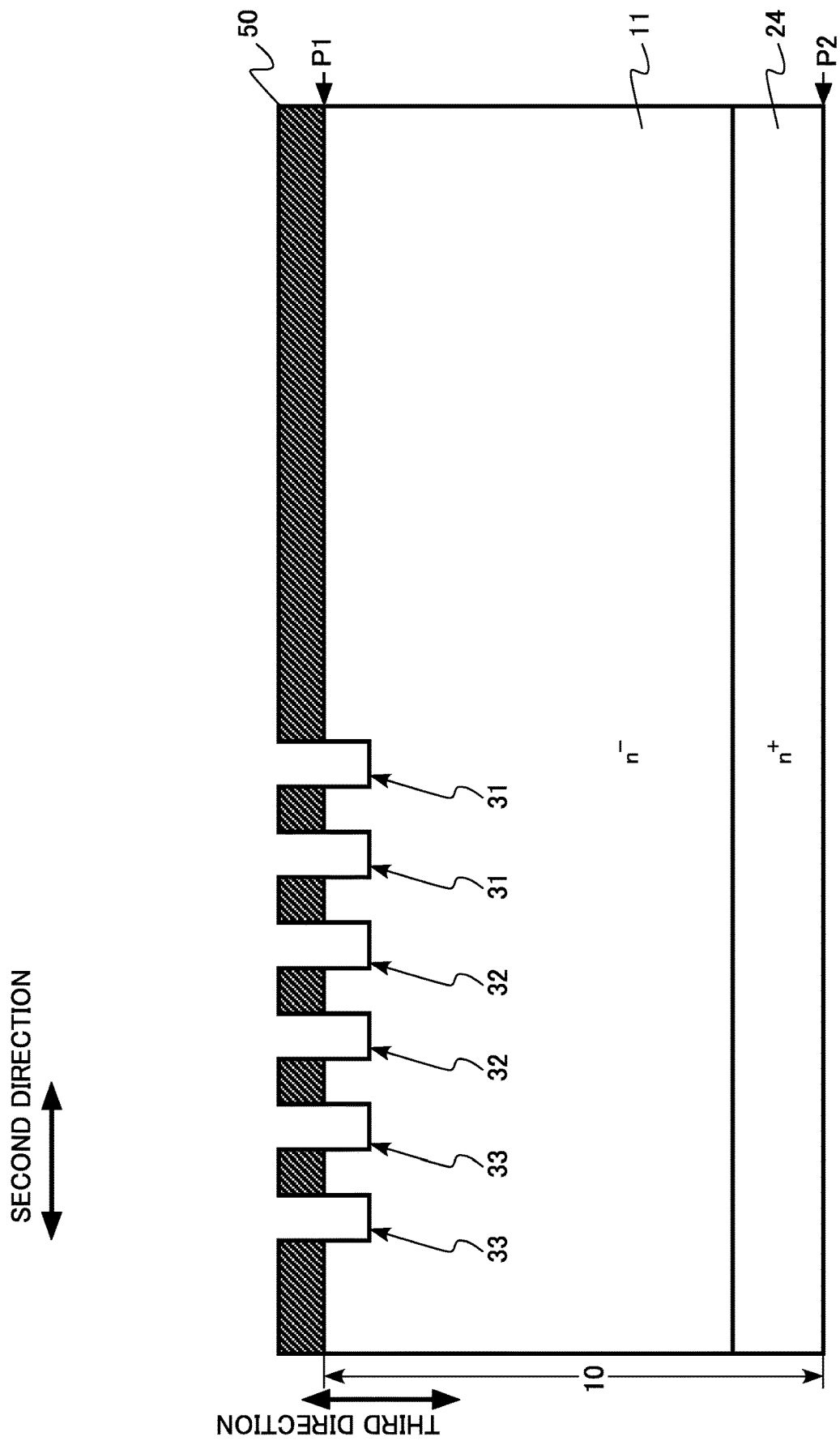
FIG. 6 is a schematic sectional view showing an example of the method of manufacturing the semiconductor device according to the first embodiment.

Next, using the mask material 50 as a mask, in the epitaxial layer 11, the first termination trenches 31 (first trenches), the second termination trenches 32 (second trenches), and the third termination trenches 33 (third trenches) are formed (FIG. 6). The first termination trenches 31, the second termination trenches 32, and the third termination trenches 33 are formed by using the RIE method.

Figure 7:
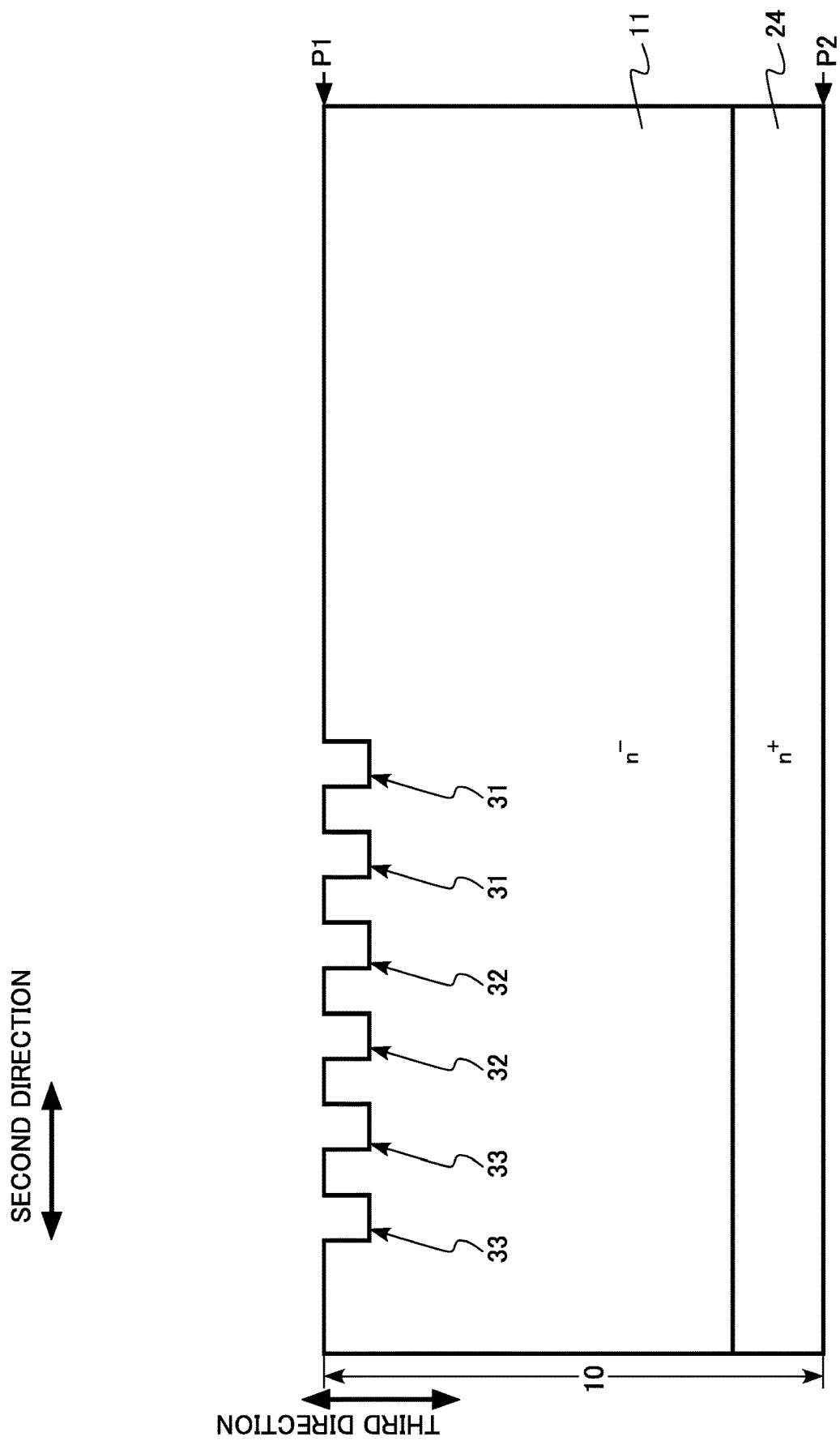
FIG. 7 is a schematic sectional view showing the example of the method of manufacturing the semiconductor device according to the first embodiment.

Next, the mask material 50 is removed by, for example, wet etching (FIG. 7).

Next, a mask material 51 is formed on the epitaxial layer 11. The mask material 51 has an opening. The mask material 51 is formed by, for example, deposition of a film by the CVD method, the lithography method, and patterning of the film by using the RIE method. The mask material 51 is, for example, a silicon oxide film.

Figure 8:
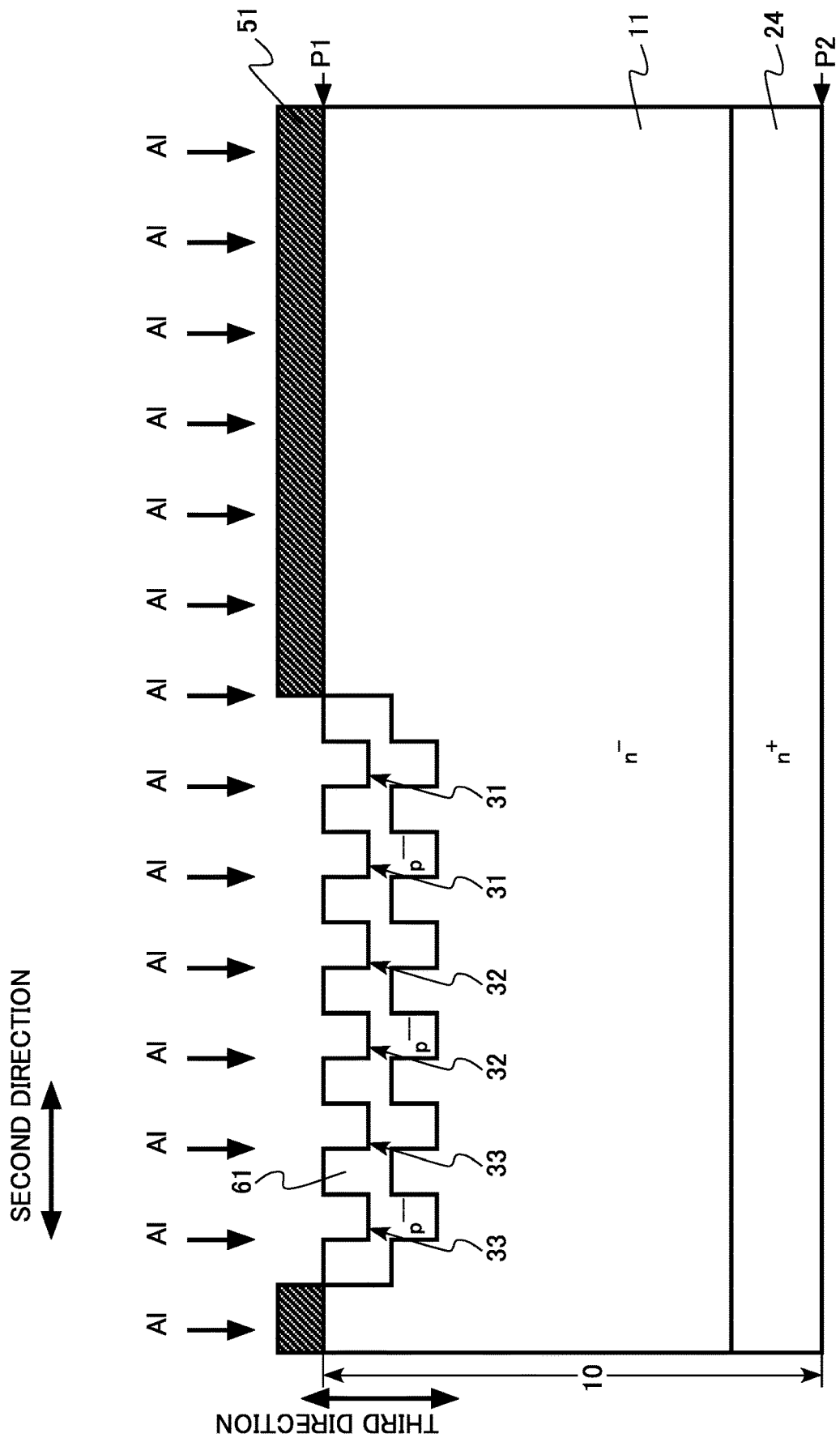
FIG. 8 is a schematic sectional view showing the example of the method of manufacturing the semiconductor device according to the first embodiment.

Next, using the mask material 51 as a mask, a p$^{--}$-type impurity region 61 is formed in the epitaxial layer 11 by an ion implantation method (FIG. 8). For example, aluminum is introduced into the epitaxial layer 11 as a p-type impurity. The p$^{--}$-type impurity region 61 will later become the first p-type region 41, the second p-type region 42, and the third p-type region 43.

Next, the mask material 51 is removed by, for example, wet etching.

Next, a mask material 52 is formed on the epitaxial layer 11. The mask material 52 has an opening. The mask material 52 is formed by, for example, deposition of a film by the CVD method, the lithography method, and patterning of the film by using the RIE method. The mask material 52 is, for example, a silicon oxide film.

Figure 9:
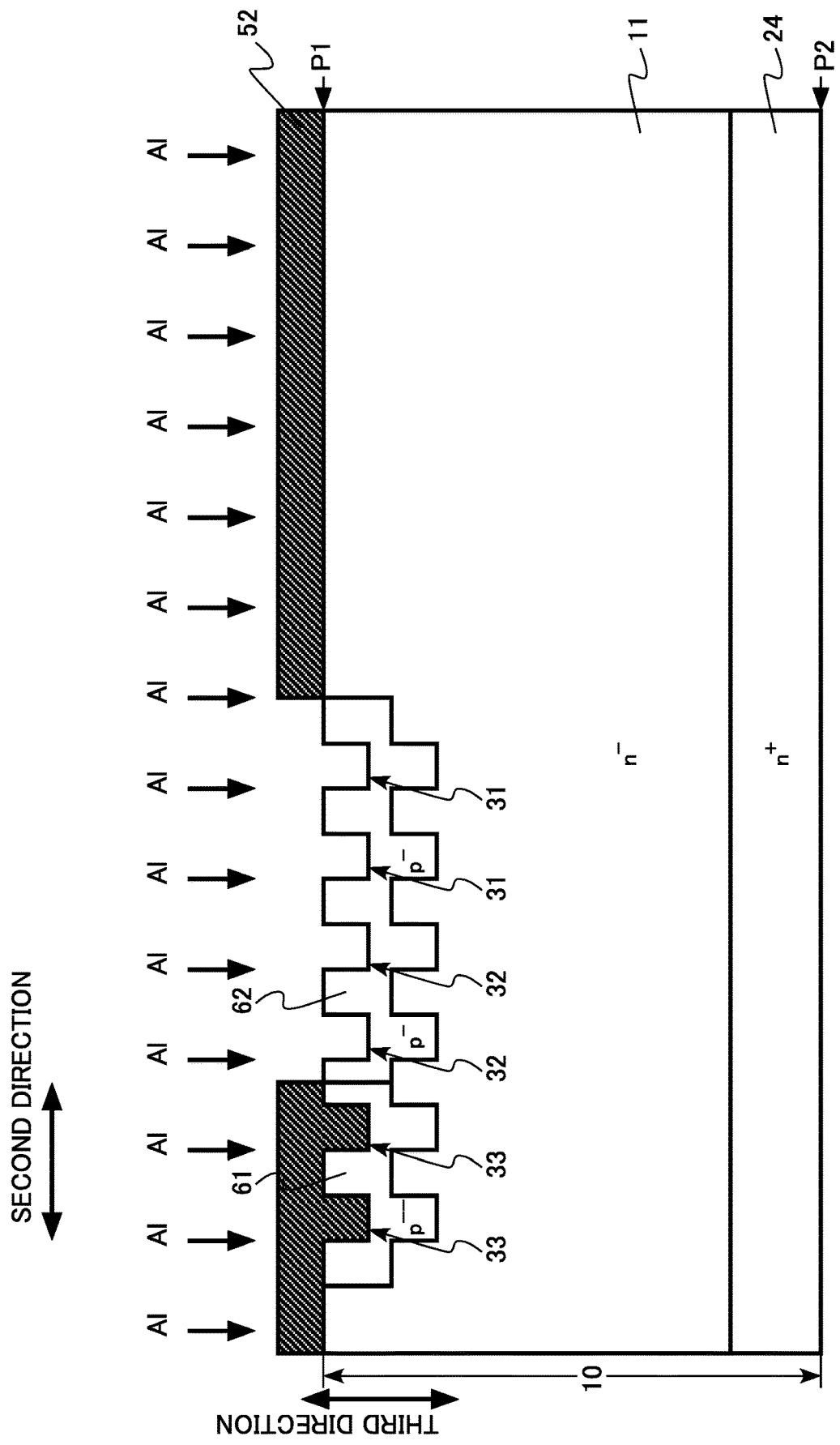
FIG. 9 is a schematic sectional view showing the example of the method of manufacturing the semiconductor device according to the first embodiment.

Next, using the mask material 52 as a mask, a p$^-$-type impurity region 62 is formed in the epitaxial layer 11 by the ion implantation method (FIG. 9). For example, aluminum is introduced into the epitaxial layer 11 as a p-type impurity. The p$^-$-type impurity region 62 will later become the first p-type region 41 and the second p-type region 42.

Next, the mask material 52 is removed by, for example, wet etching.

Next, a mask material 53 is formed on the epitaxial layer 11. The mask material 53 has an opening. The mask material 53 is formed by, for example, deposition of a film by the CVD method, the lithography method, and patterning of the film by using the RIE method. The mask material 53 is, for example, a silicon oxide film.

Figure 10:
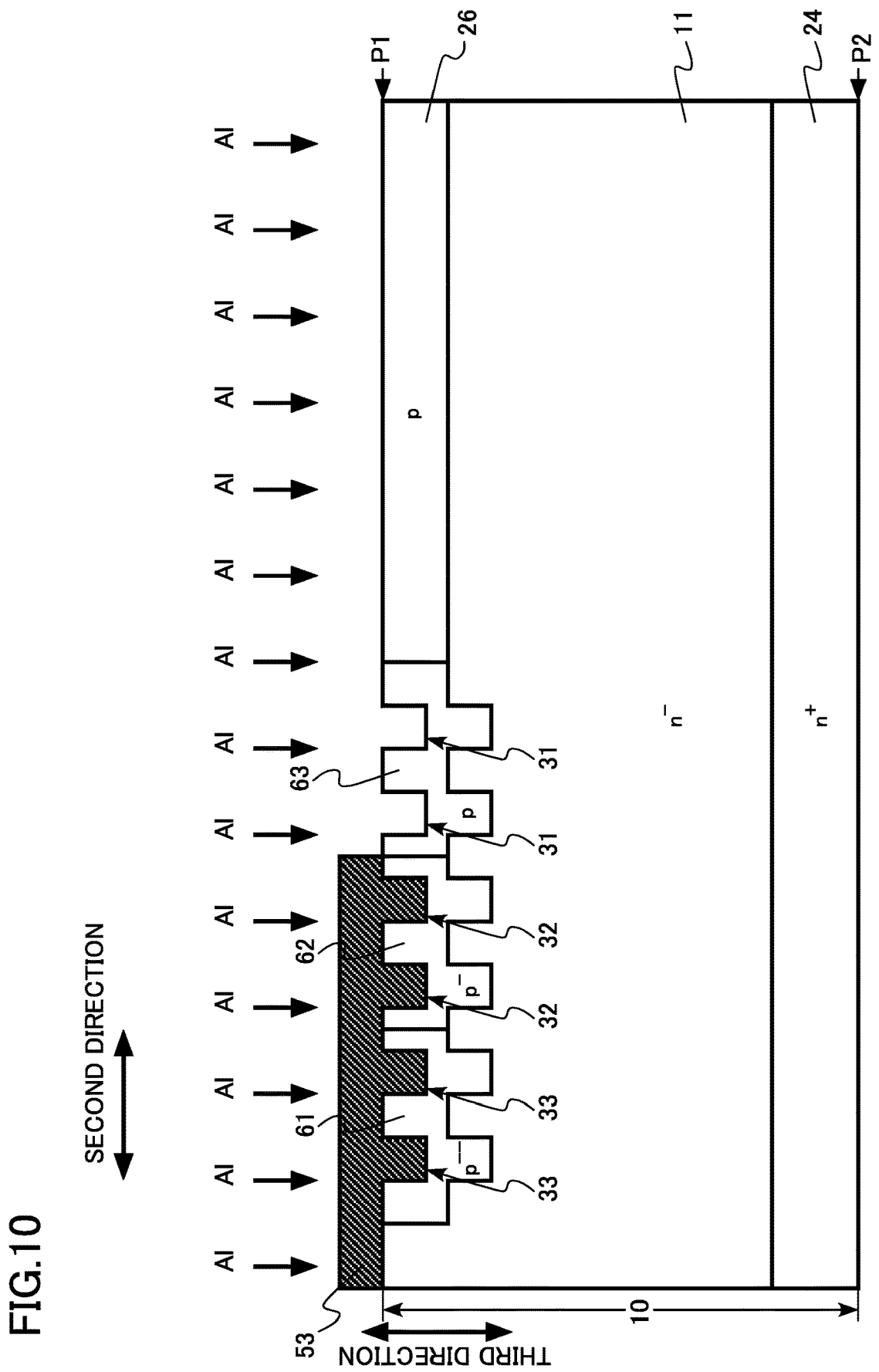
FIG. 10 is a schematic sectional view showing the example of the method of manufacturing the semiconductor device according to the first embodiment.

Next, using the mask material 53 as a mask, a p-type impurity region 63 and the p-type body region 26 are formed in the epitaxial layer 11 by the ion implantation method (FIG. 10). For example, aluminum is introduced into the epitaxial layer 11 as a p-type impurity. The p-type region 63 will later become the first p-type region 41.

Next, the mask material 53 is removed by, for example, wet etching.

Next, a mask material 54 is formed on the epitaxial layer 11. The mask material 54 has an opening. The mask material 54 is formed by, for example, deposition of a film by the CVD method, the lithography method, and patterning of the film by using the RIE method. The mask material 54 is, for example, a silicon oxide film.

Figure 11:
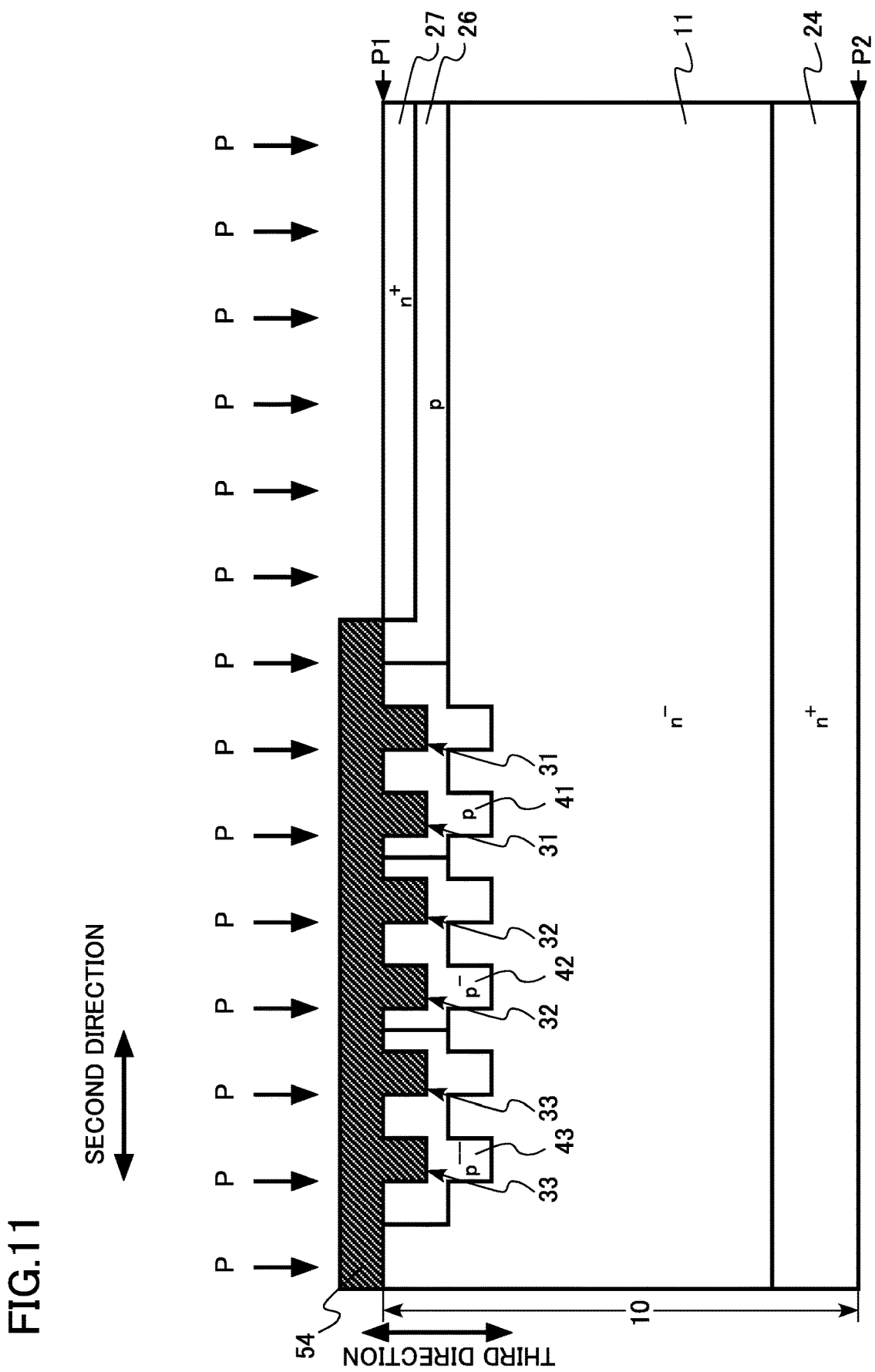
FIG. 11 is a schematic sectional view showing the example of the method of manufacturing the semiconductor device according to the first embodiment.

Next, using the mask material 54 as a mask, the n$^+$-type source region 27 is formed in the epitaxial layer 11 by the ion implantation method (FIG. 11). For example, phosphorus (P) is introduced into the epitaxial layer 11 as an n-type impurity.

Figure 12:
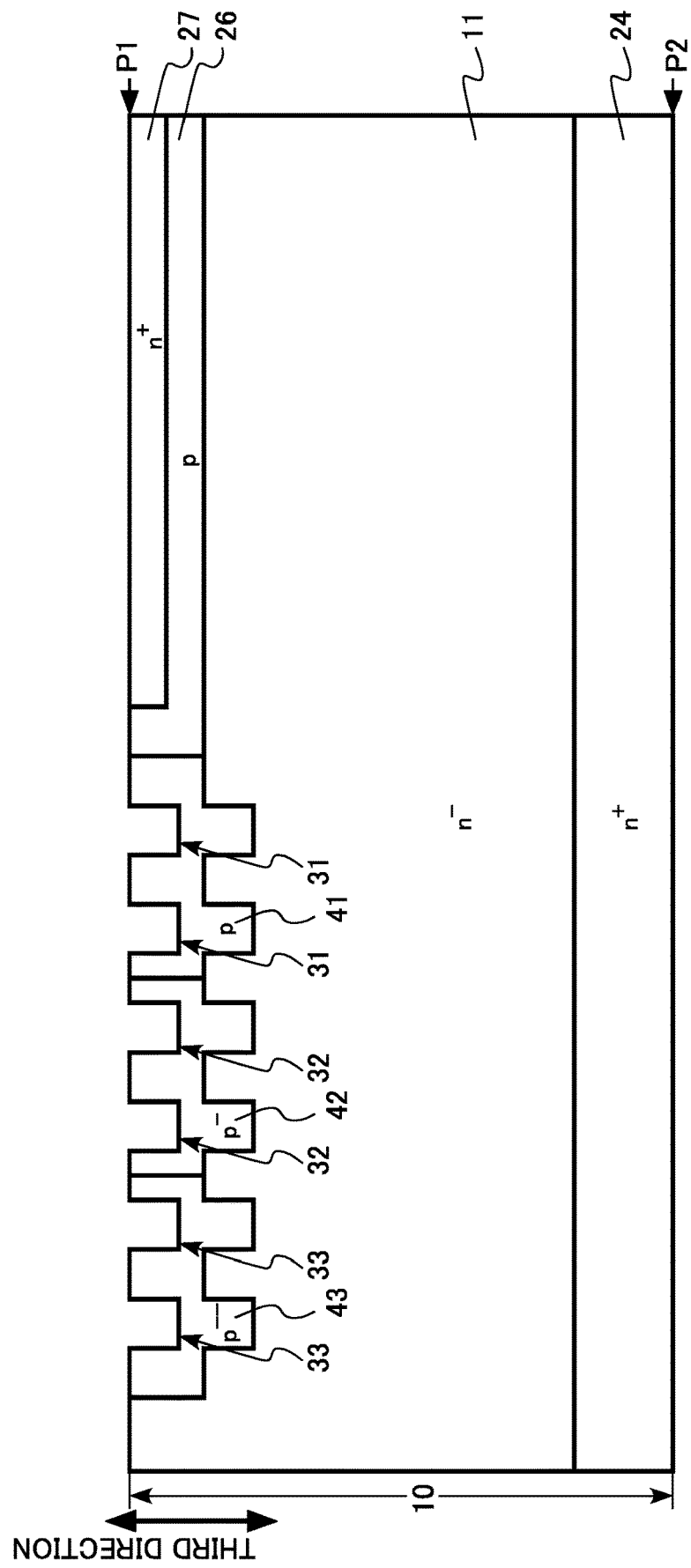
FIG. 12 is a schematic sectional view showing the example of the method of manufacturing the semiconductor device according to the first embodiment.

Next, the mask material 54 is removed by, for example, wet etching (FIG. 12).

Figure 13:
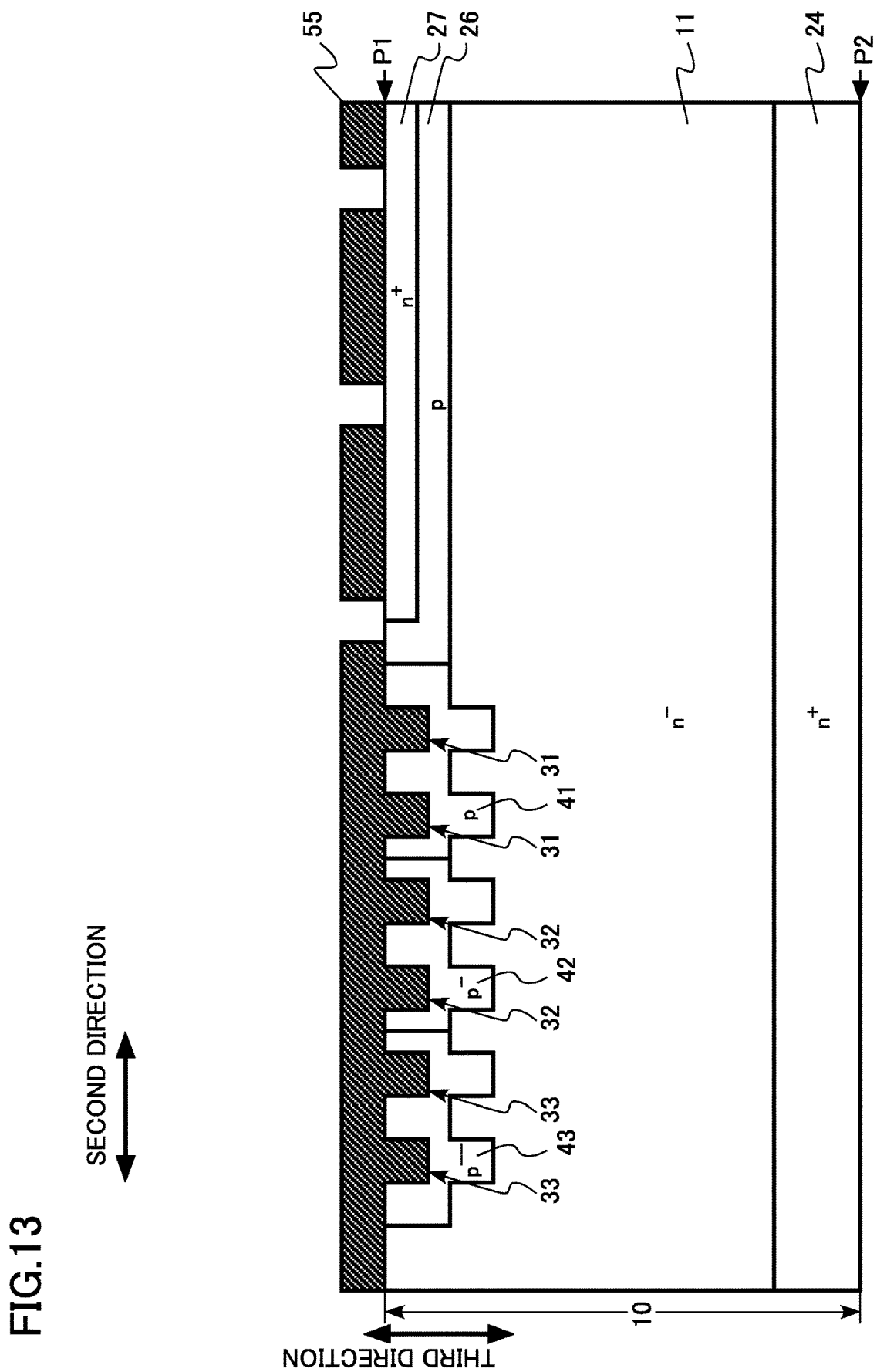
FIG. 13 is a schematic sectional view showing the example of the method of manufacturing the semiconductor device according to the first embodiment.

Next, a mask material 55 is formed on the epitaxial layer 11 (FIG. 13). The mask material 55 has an opening. The mask material 55 is formed by, for example, deposition of a film by the CVD method, the lithography method, and patterning of the film by using the RIE method. The mask material 55 is, for example, a silicon oxide film.

Figure 14:
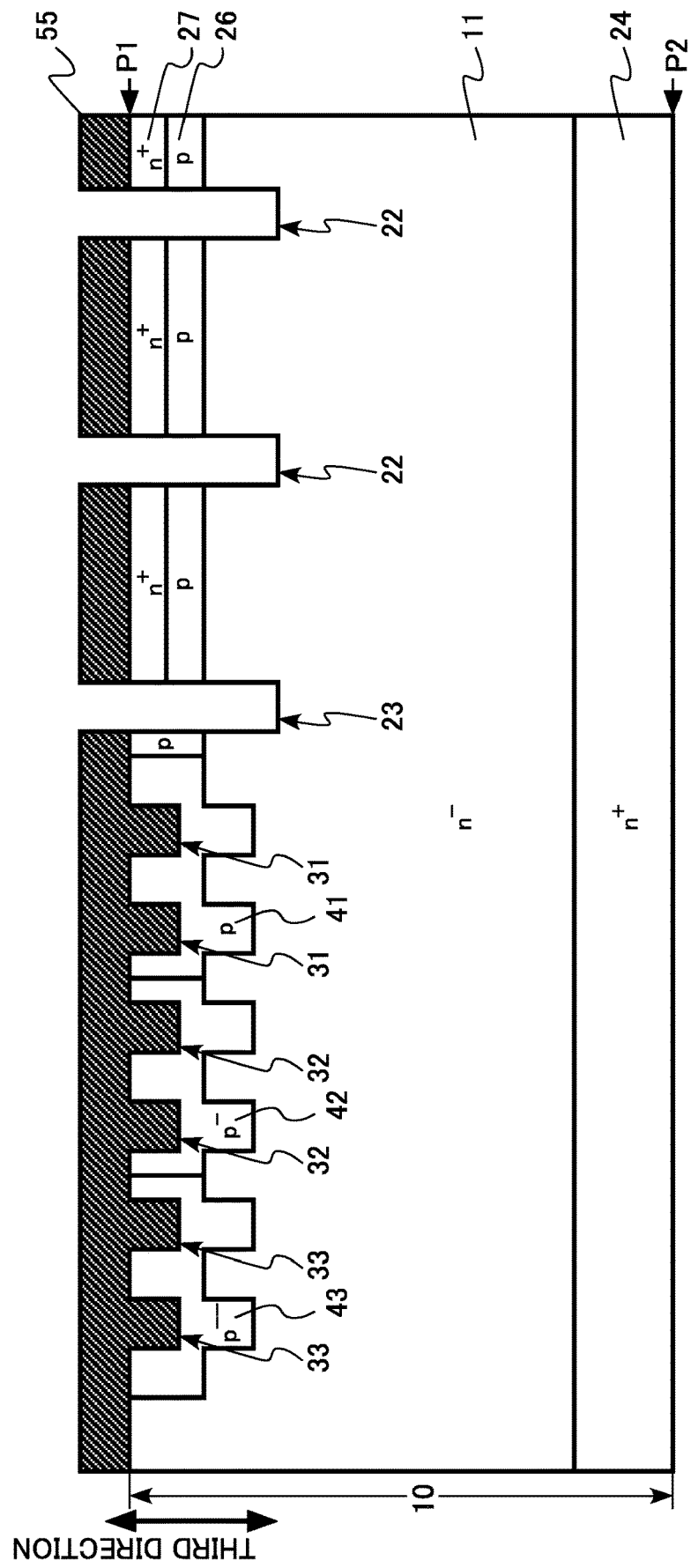
FIG. 14 is a schematic sectional view showing the example of the method of manufacturing the semiconductor device according to the first embodiment.

Next, using the mask material 55 as a mask, the contact trenches 22 and the dummy trenches 23 are formed in the epitaxial layer 11 (FIG. 14). The contact trenches 22 and the dummy trenches 23 are formed by using the RIE method.

Figure 15:
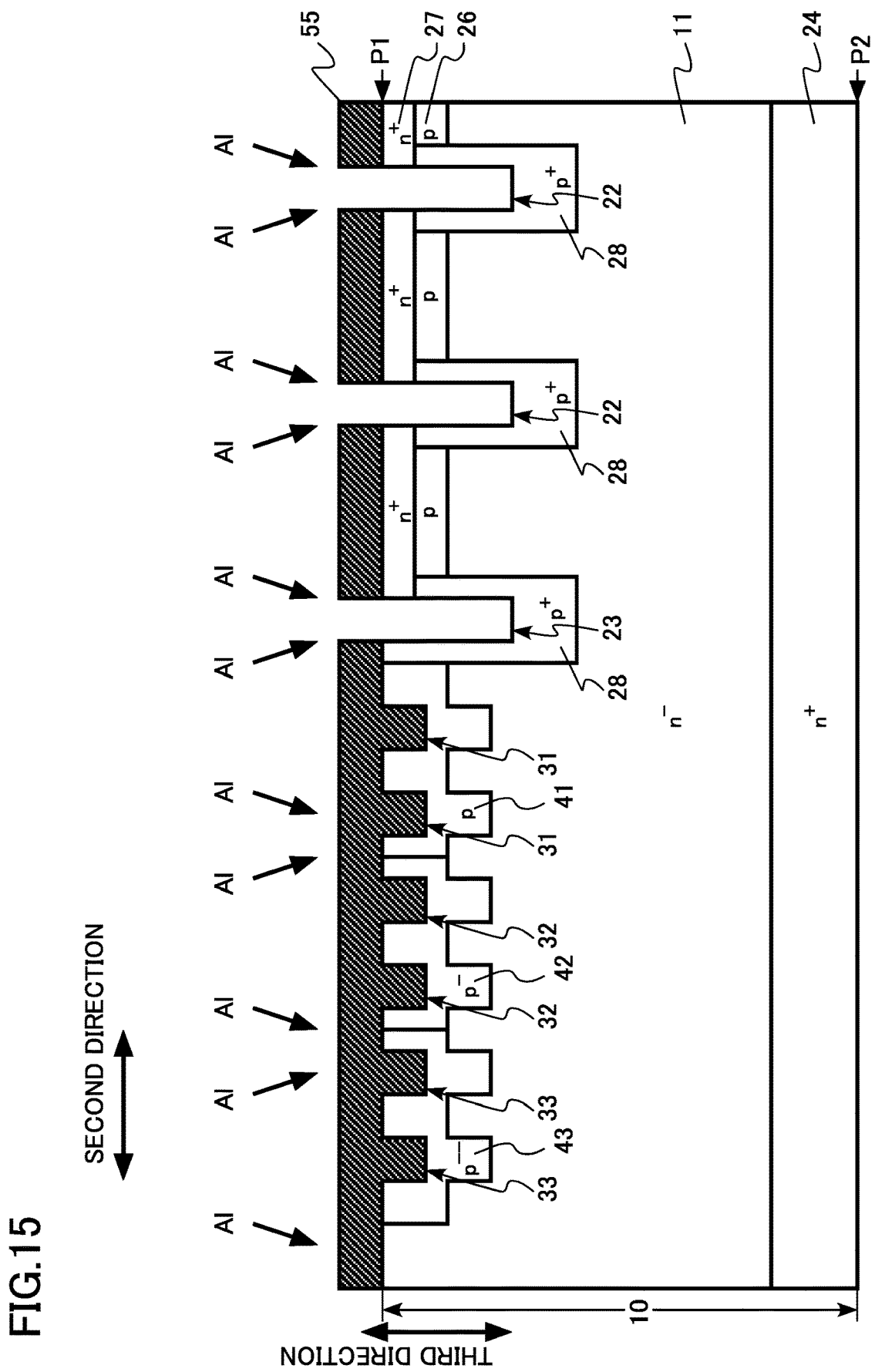
FIG. 15 is a schematic sectional view showing the example of the method of manufacturing the semiconductor device according to the first embodiment.

Next, using the mask material 55 as a mask, the p$^+$-type electric field relaxation regions 28 are formed in the epitaxial layer 11 by the ion implantation method (FIG. 15). For example, aluminum is introduced into the epitaxial layer 11 as a p-type impurity by oblique ion implantation. The electric field relaxation regions 28 are formed around the contact trenches 22 and the dummy trenches 23.

Figure 16:
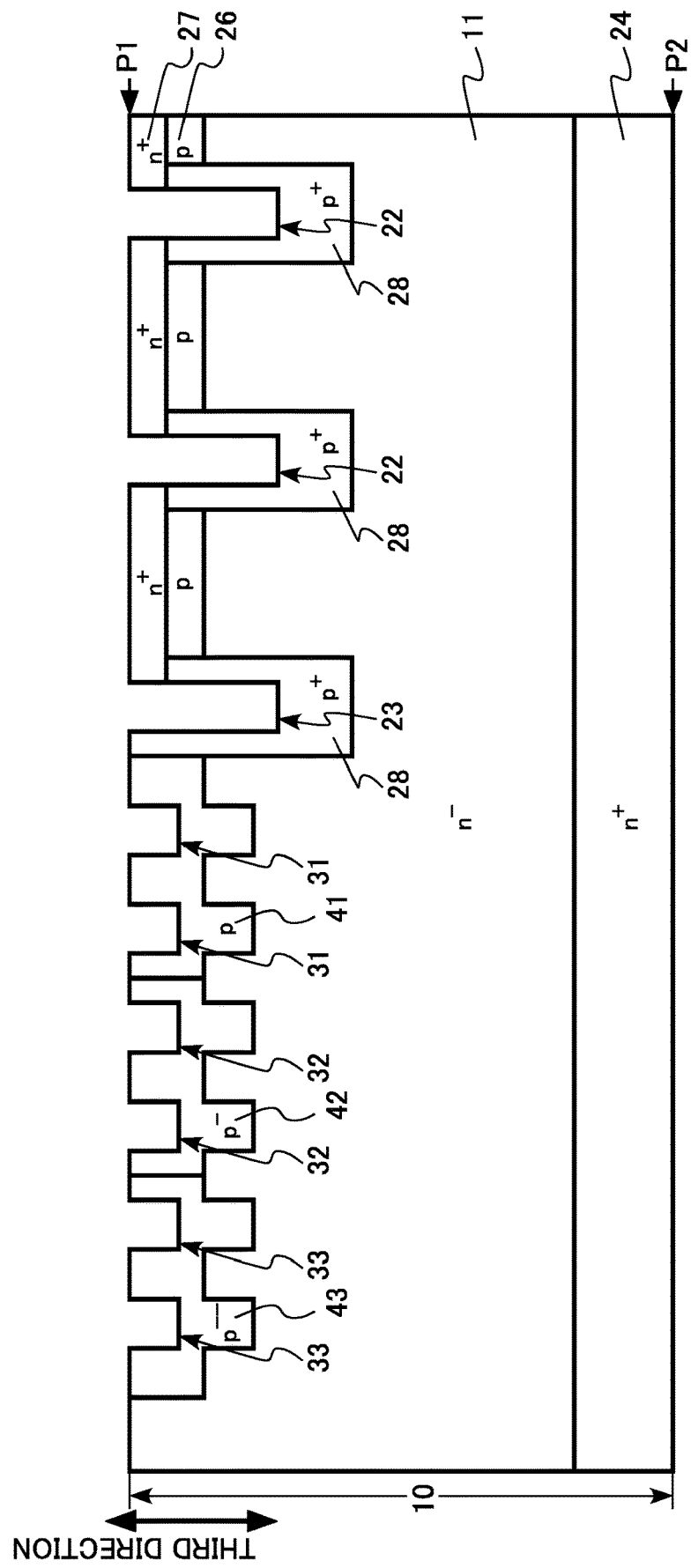
FIG. 16 is a schematic sectional view showing the example of the method of manufacturing the semiconductor device according to the first embodiment.

Next, the mask material 55 is removed by, for example, wet etching (FIG. 16). Next, activation annealing of the n-type impurities and p-type impurities introduced into the epitaxial layer 11 is performed.

Figure 17:
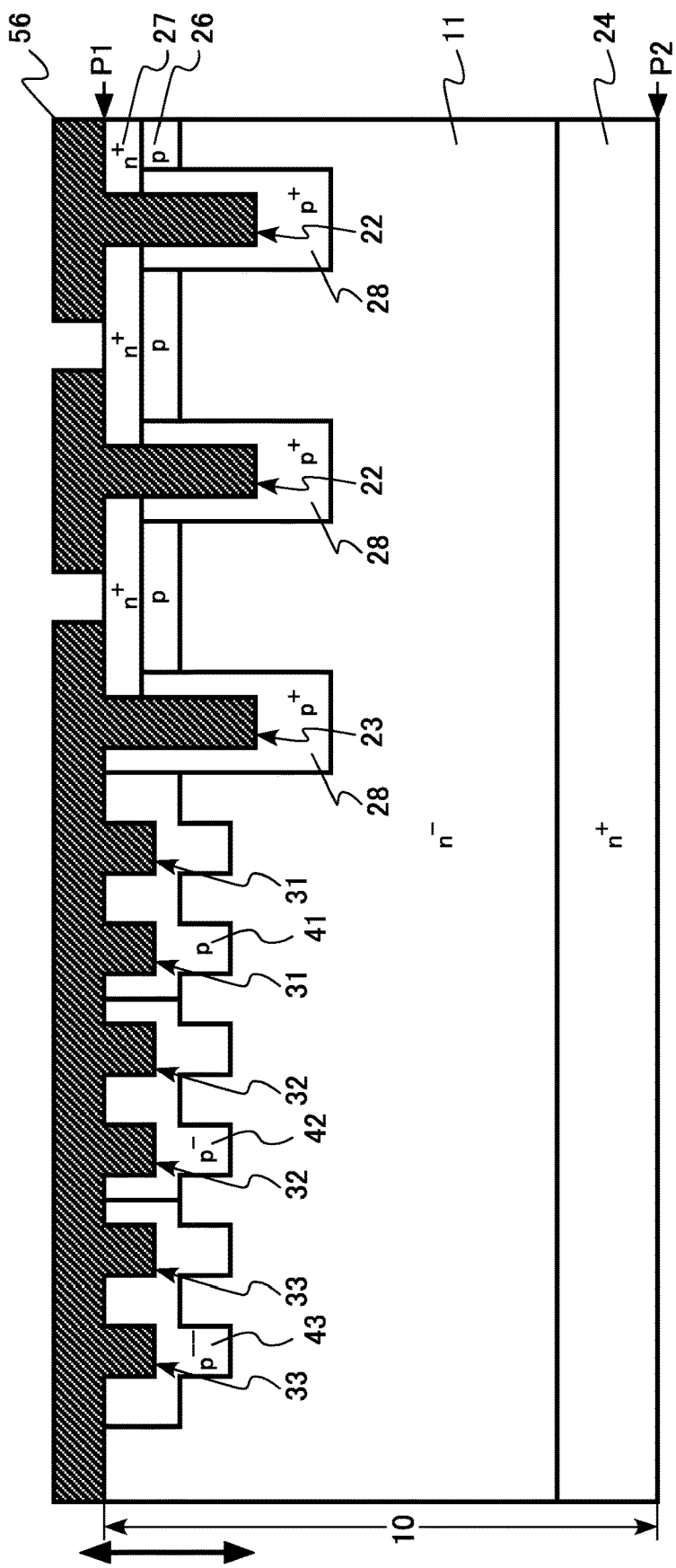
FIG. 17 is a schematic sectional view showing the example of the method of manufacturing the semiconductor device according to the first embodiment.

Next, a mask material 56 is formed on the epitaxial layer 11 (FIG. 17). The mask material 56 has an opening. The mask material 56 is formed by, for example, deposition of a film by the CVD method, the lithography method, and patterning of the film by using the RIE method. The mask material 56 is, for example, a silicon oxide film.

Figure 18:
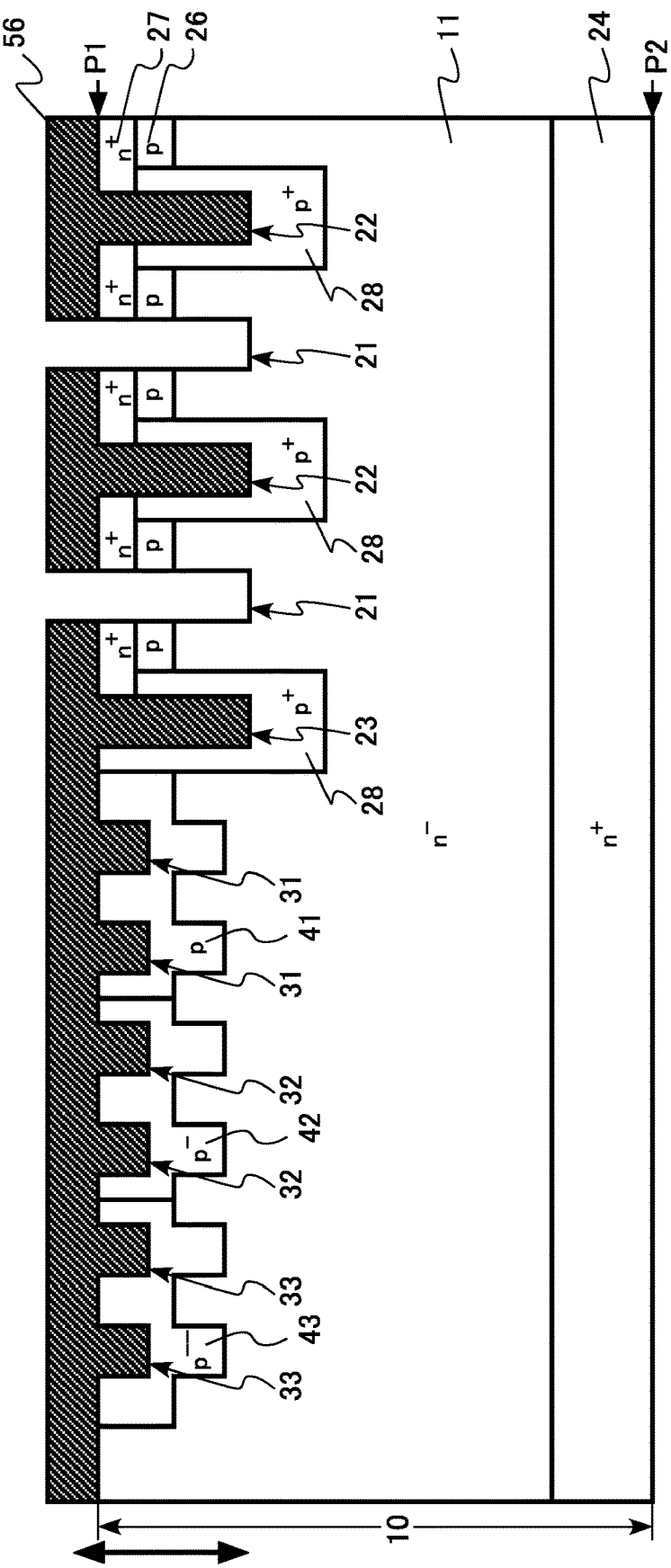
FIG. 18 is a schematic sectional view showing the example of the method of manufacturing the semiconductor device according to the first embodiment.

Next, using the mask material 56 as a mask, the gate trenches 21 are formed in the epitaxial layer 11 (FIG. 18). The gate trenches 21 are formed by using the RIE method.

Figure 19:
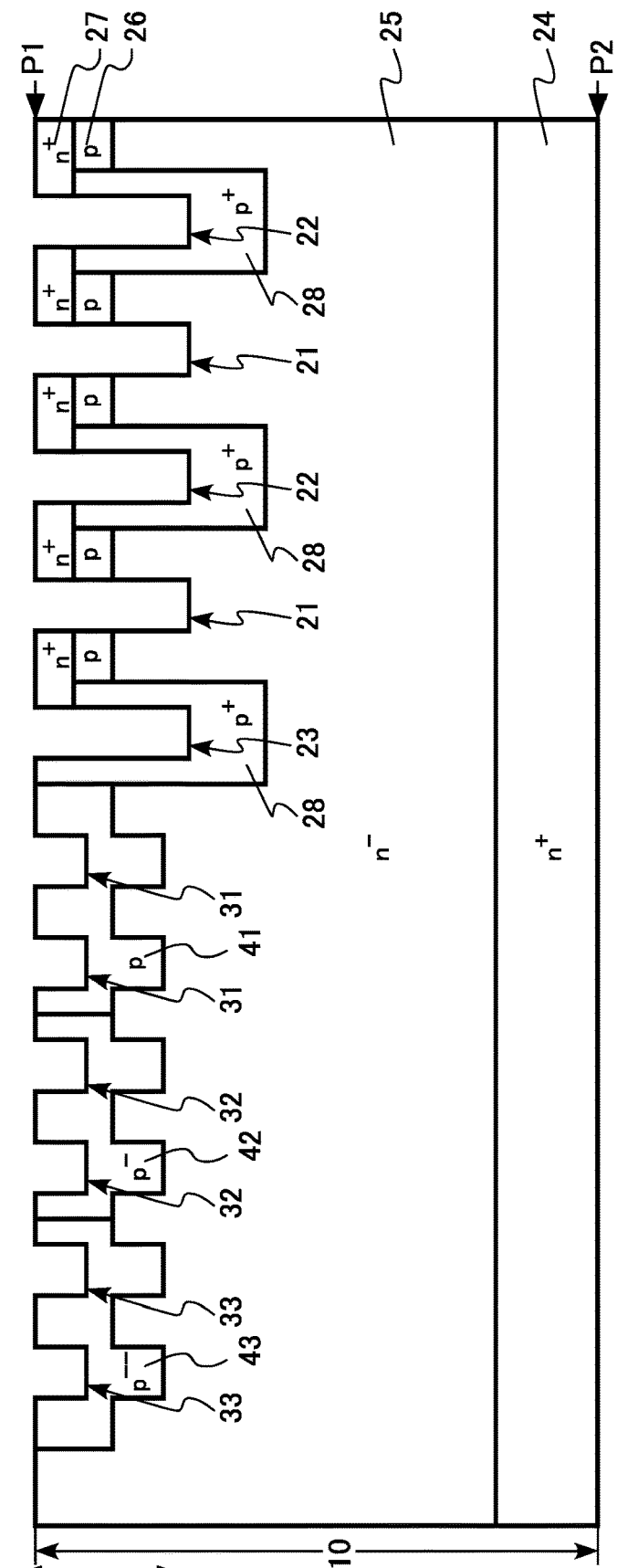
FIG. 19 is a schematic sectional view showing the example of the method of manufacturing the semiconductor device according to the first embodiment.

Next, the mask material 56 is removed by, for example, wet etching (FIG. 19).

Figure 20:
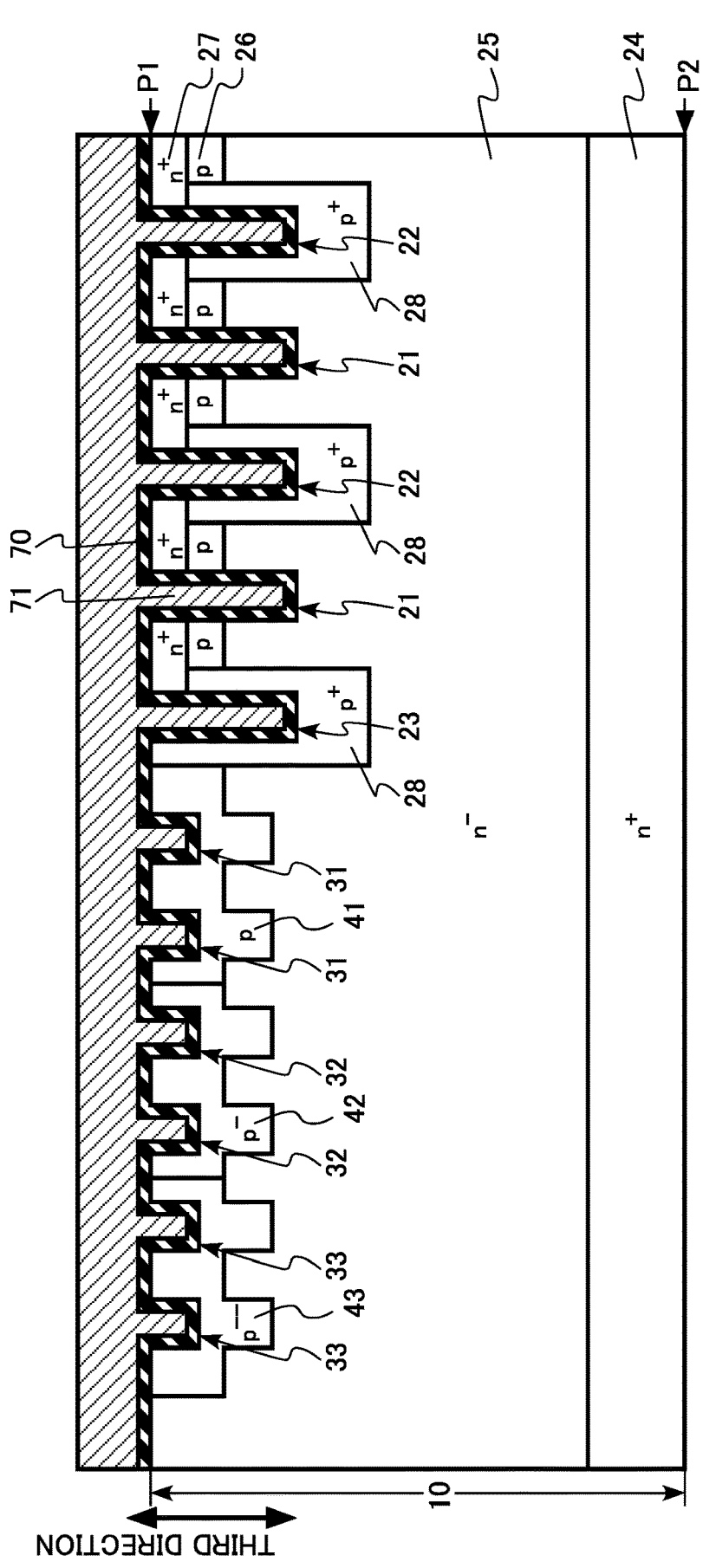
FIG. 20 is a schematic sectional view showing the example of the method of manufacturing the semiconductor device according to the first embodiment.

Next, a first silicon oxide film 70 and a polycrystalline silicon film 71 are formed in the gate trenches 21, the contact trenches 22, the dummy trenches 23, the first termination trenches 31, the second termination trenches 32, and the third termination trenches 33 (FIG. 20).

The first silicon oxide film 70 and the polycrystalline silicon film 71 are formed by, for example, the CVD method. A part of the first silicon oxide film 70 becomes the gate insulating layer 18. A part of the polycrystalline silicon film 71 becomes the gate electrode 16.

Figure 21:
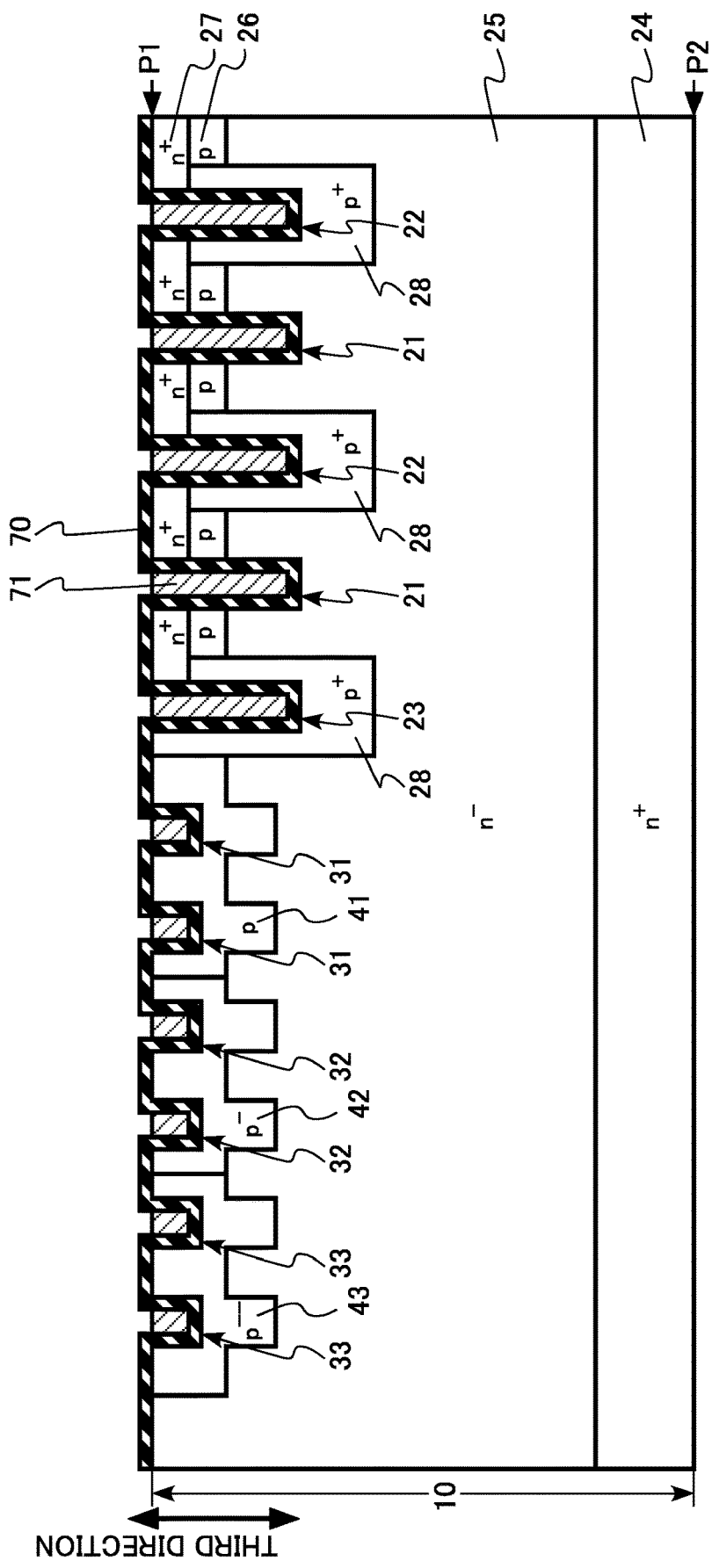
FIG. 21 is a schematic sectional view showing the example of the method of manufacturing the semiconductor device according to the first embodiment.

Next, the polycrystalline silicon film 71 on the front face of the silicon carbide layer 10 is removed (FIG. 21). The polycrystalline silicon film 71 on the front face of the silicon carbide layer 10 is removed by, for example, a dry etching method. A part of the polycrystalline silicon film 71 remains in each of the gate trenches 21, the contact trenches 22, the dummy trenches 23, the first termination trenches 31, the second termination trenches 32, and the third termination trenches 33.

Figure 22:
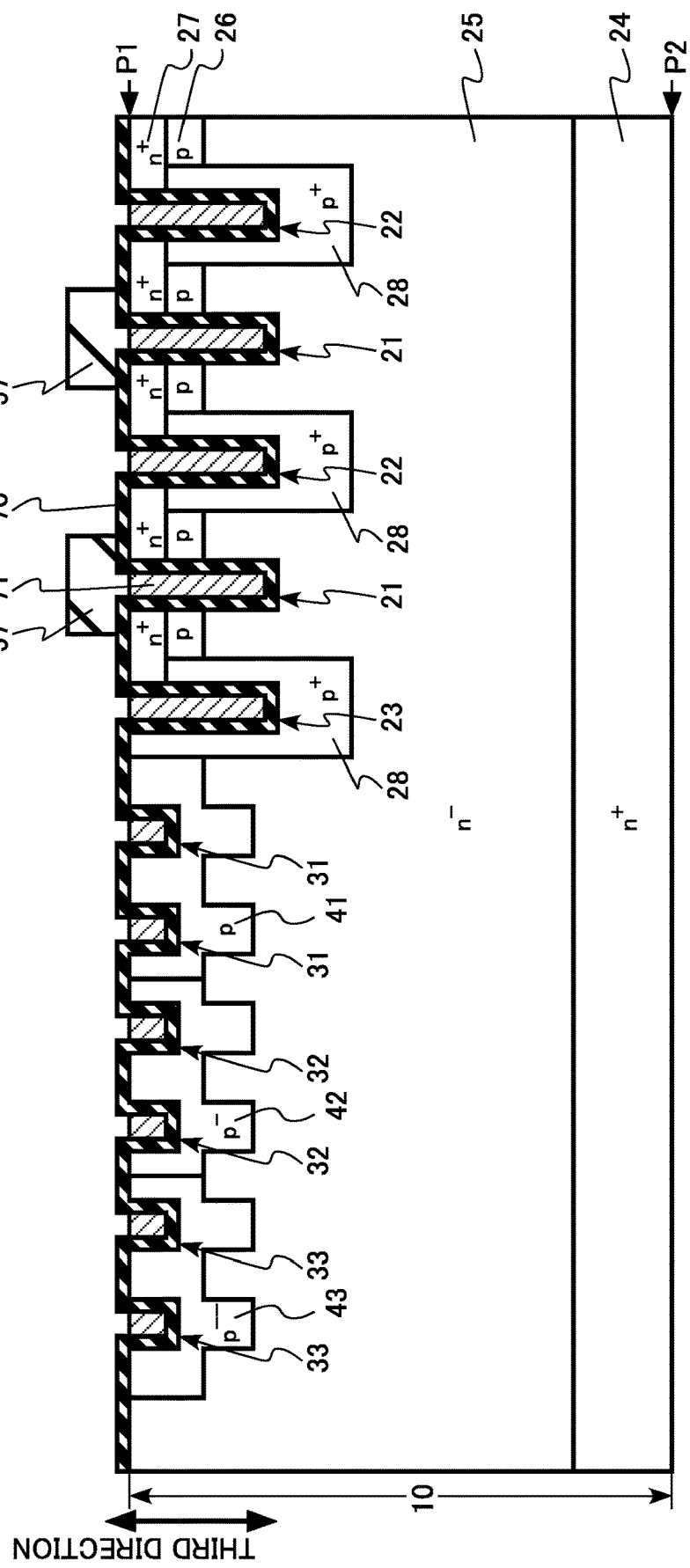
FIG. 22 is a schematic sectional view showing the example of the method of manufacturing the semiconductor device according to the first embodiment.

Next, mask materials 57 are formed on the front face of silicon carbide layer 10 (FIG. 22). The mask materials 57 are, for example, photoresists. The mask materials 57 are provided on the gate trenches 21.

Figure 23:
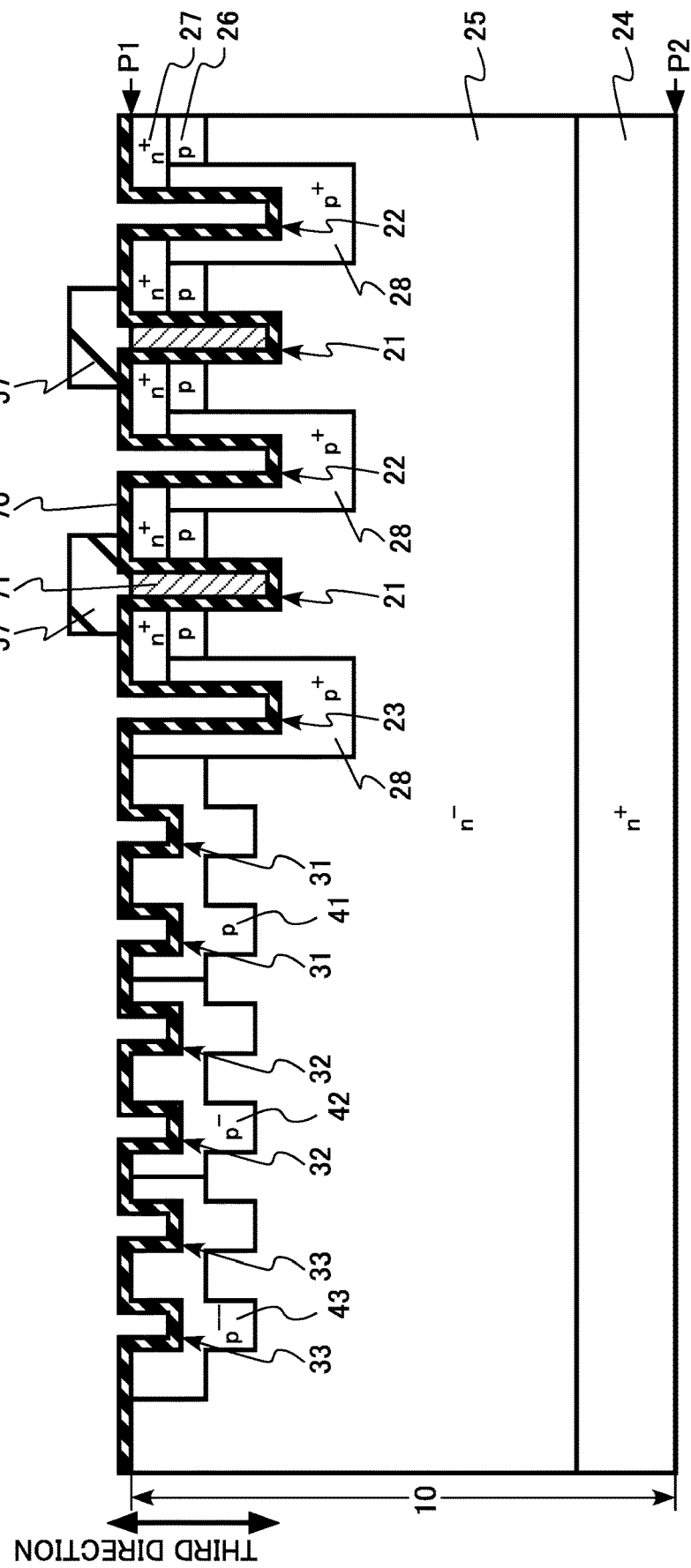
FIG. 23 is a schematic sectional view showing the example of the method of manufacturing the semiconductor device according to the first embodiment.

Next, using the mask materials 57 as masks, the polycrystalline silicon film 71 in the contact trenches 22, the dummy trenches 23, the first termination trenches 31, the second termination trenches 32, and the third termination trenches 33 is removed (FIG. 23). The polycrystalline silicon film 71 is removed by, for example, a dry etching method.

Figure 24:
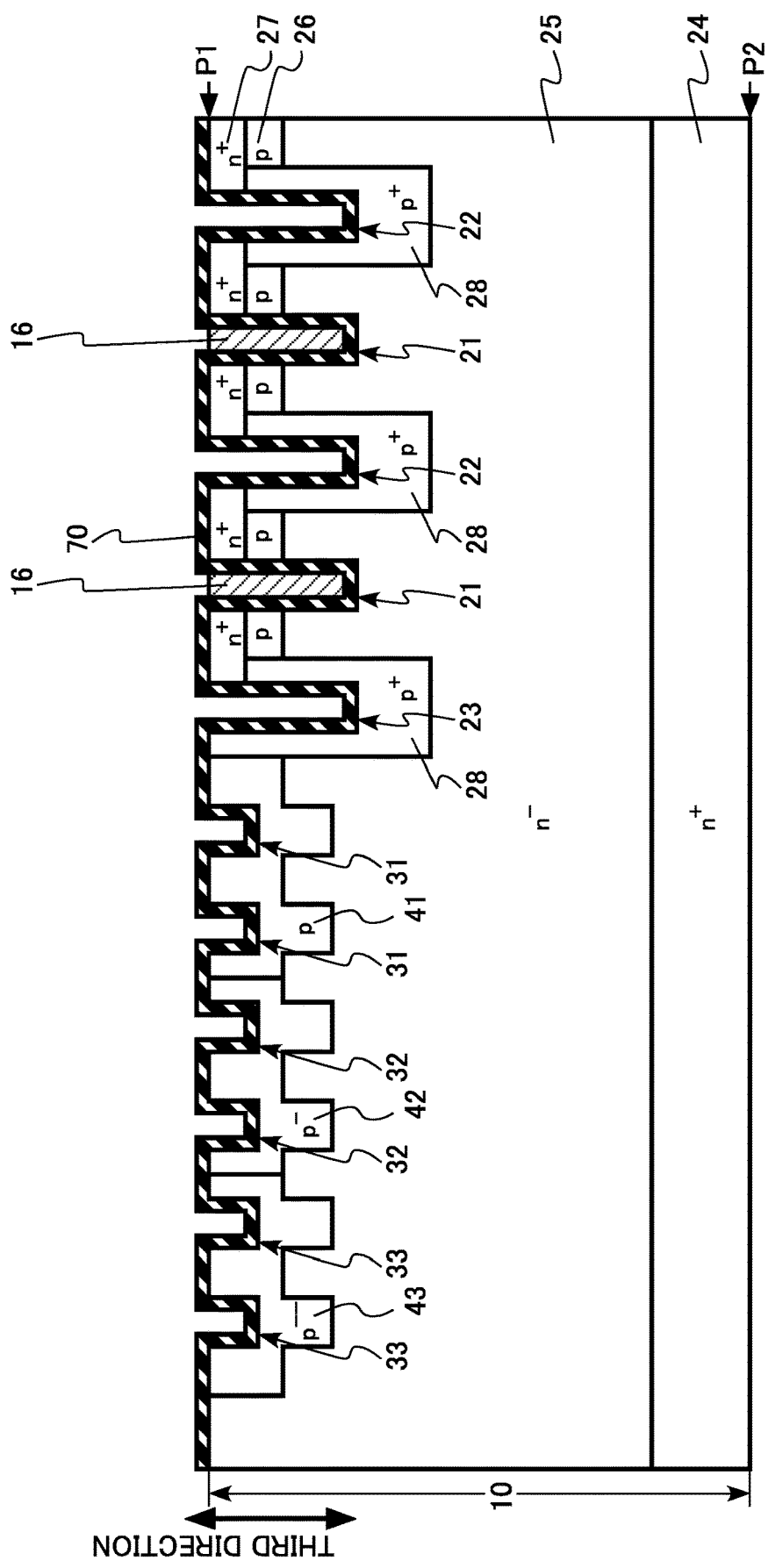
FIG. 24 is a schematic sectional view showing the example of the method of manufacturing the semiconductor device according to the first embodiment.

Next, the mask materials 57 are removed by, for example, an ashing method (FIG. 24).

Figure 25:
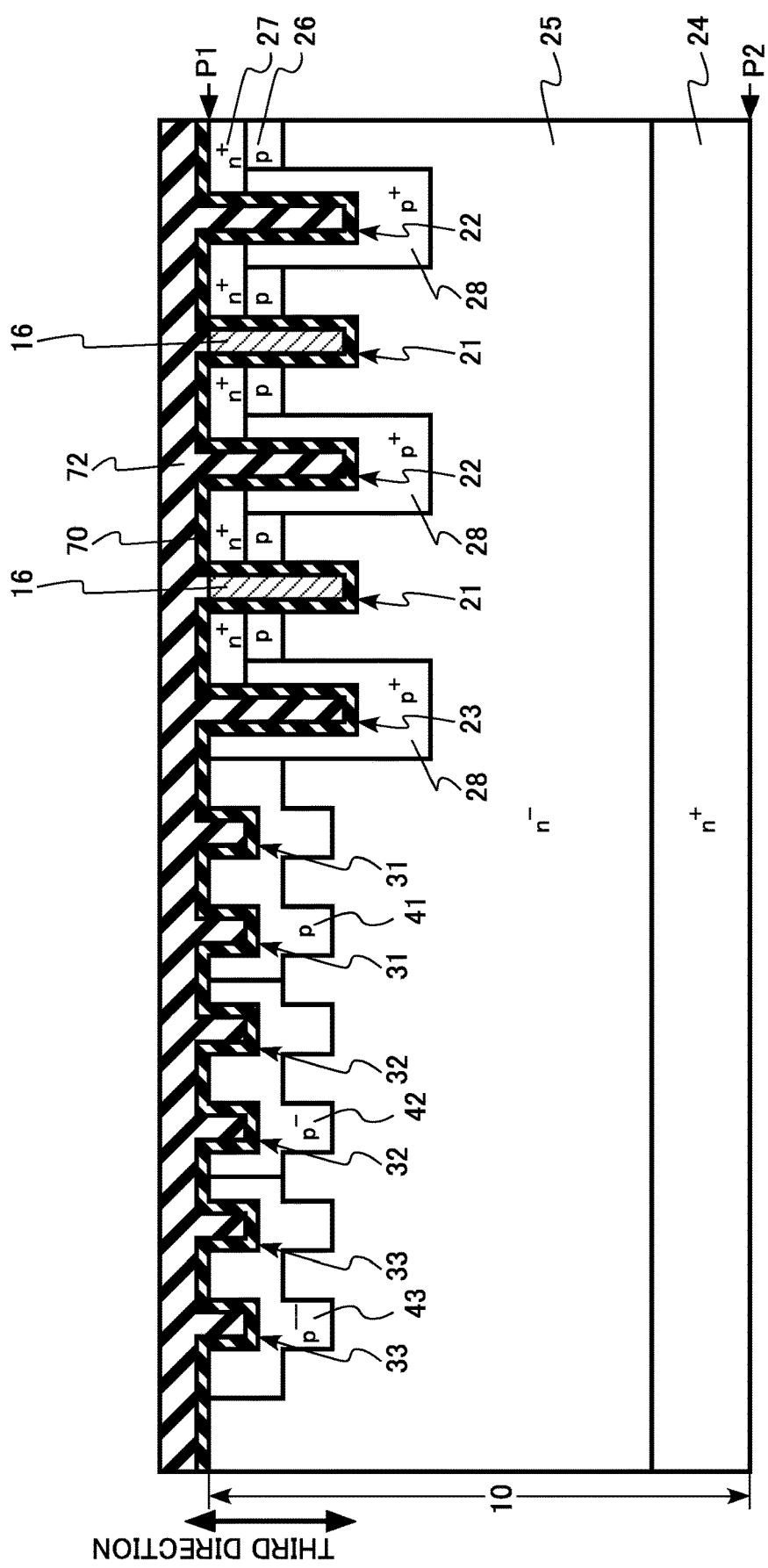
FIG. 25 is a schematic sectional view showing the example of the method of manufacturing the semiconductor device according to the first embodiment.

Next, a second silicon oxide film 72 is formed on the first silicon oxide film 70 and the gate electrodes 16 (FIG. 25). The second silicon oxide film 72 is formed by, for example, the CVD method. A part of the second silicon oxide film 72 becomes the interlayer insulating layer 20.

Figure 26:
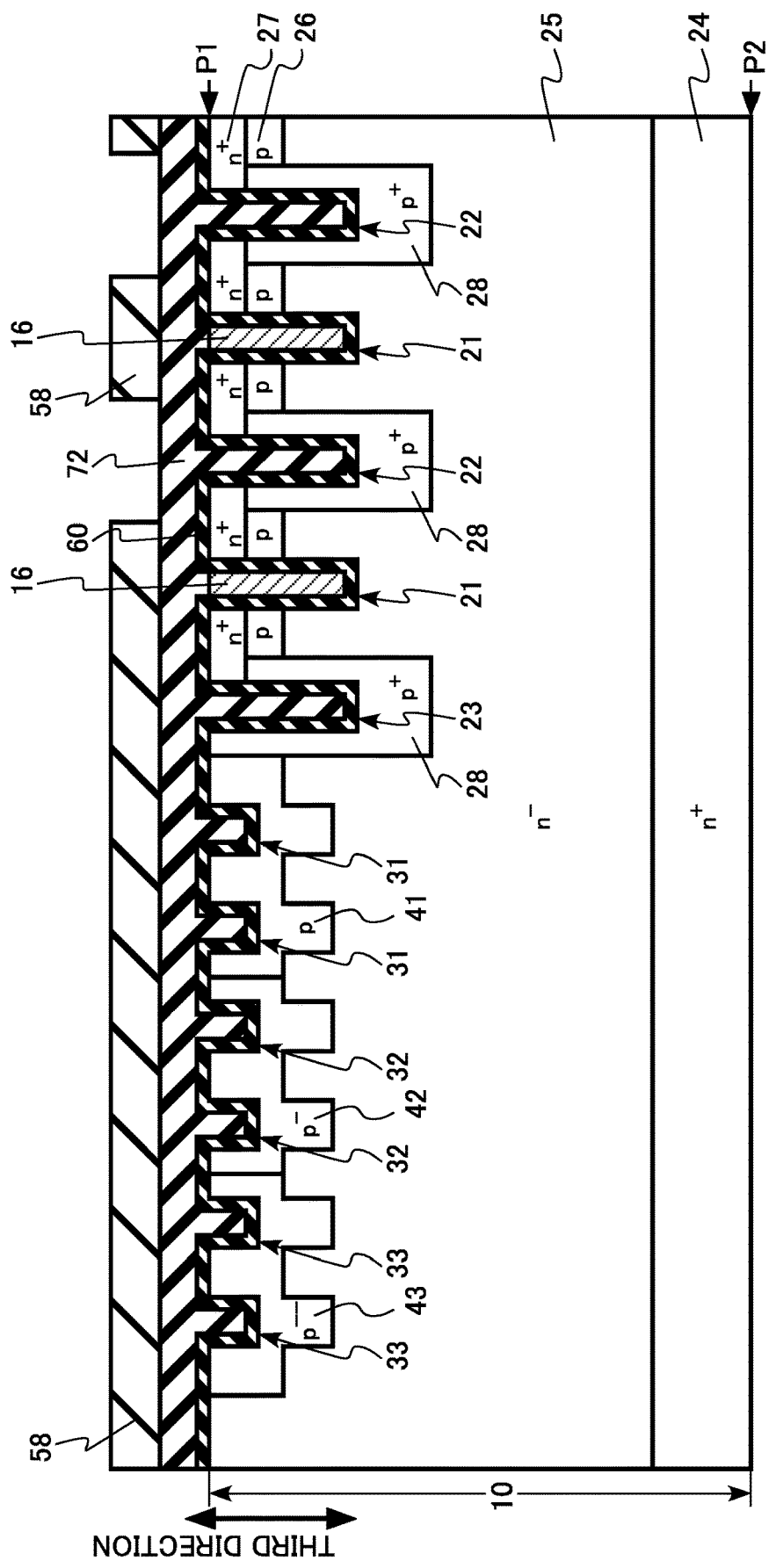
FIG. 26 is a schematic sectional view showing the example of the method of manufacturing the semiconductor device according to the first embodiment.

Next, mask materials 58 are formed on the second silicon oxide film 72 (FIG. 26). The mask materials 58 are, for example, photoresists.

Figure 27:
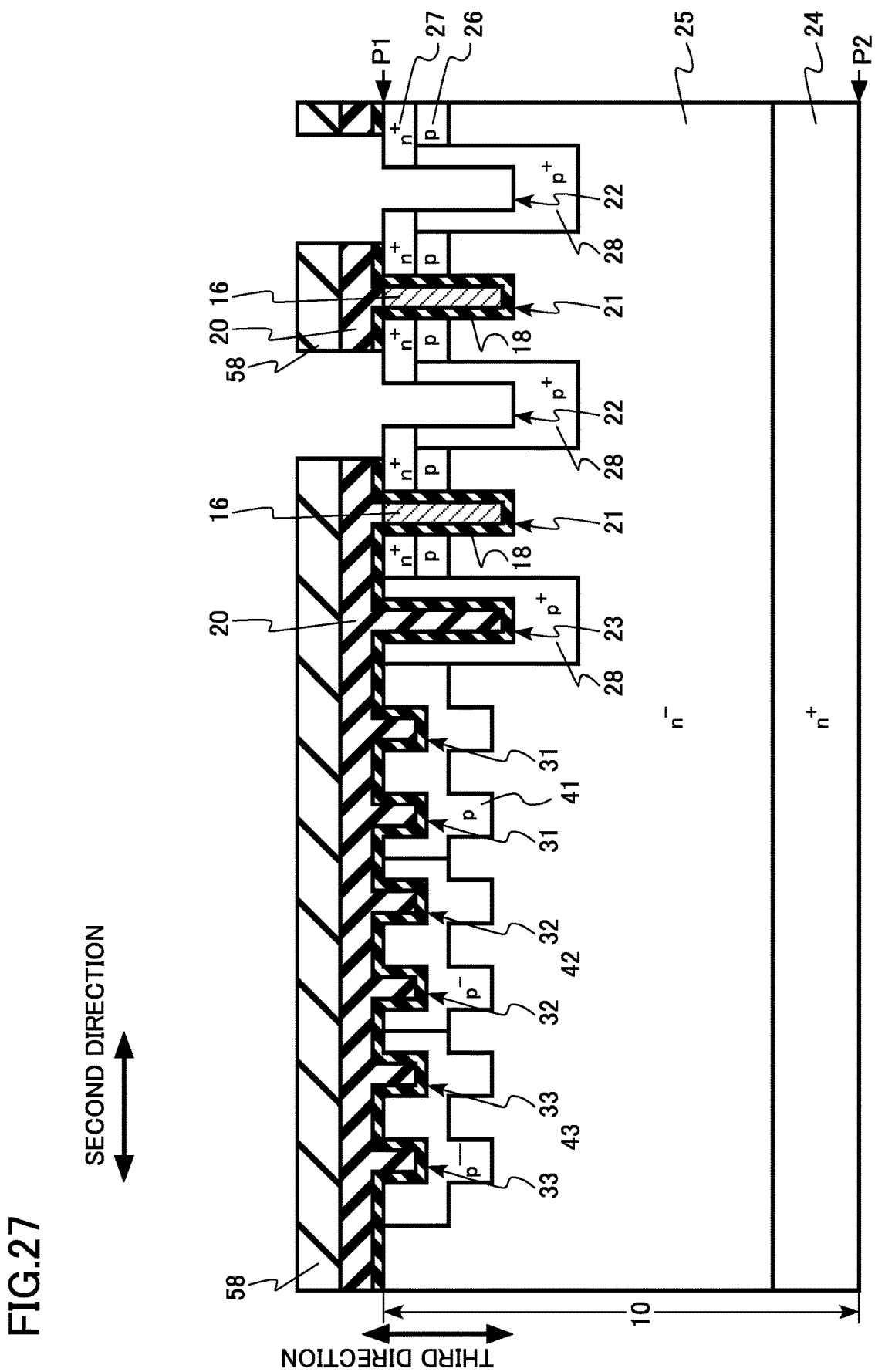
FIG. 27 is a schematic sectional view showing the example of the method of manufacturing the semiconductor device according to the first embodiment.

Next, using the mask materials 58 as masks, the first silicon oxide film 70 and the second silicon oxide film 72 in the contact trenches 22 are removed (FIG. 27). The first silicon oxide film 70 and the second silicon oxide film 72 are removed by, for example, a wet etching method.

Figure 28:
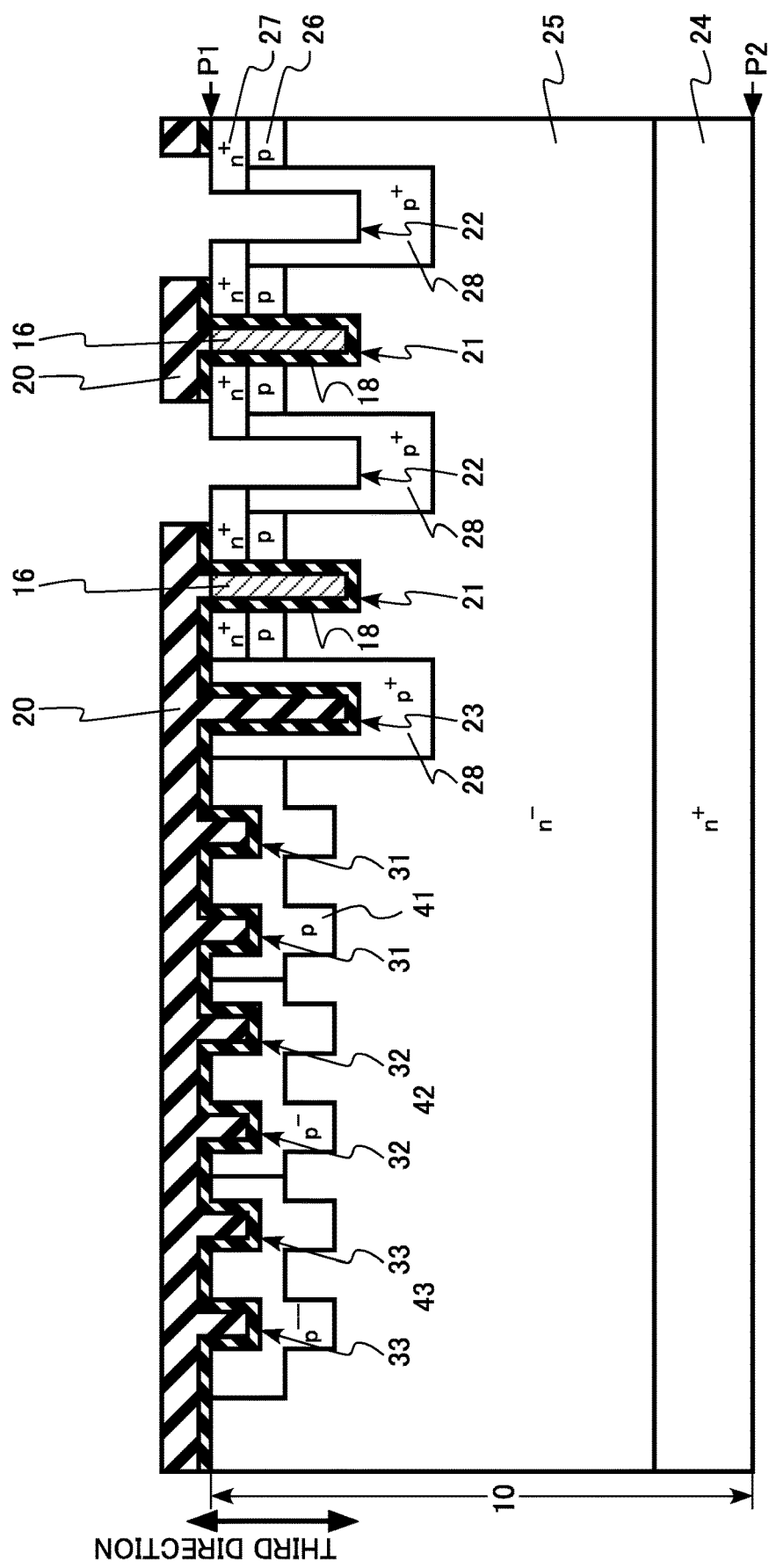
FIG. 28 is a schematic sectional view showing the example of the method of manufacturing the semiconductor device according to the first embodiment.

Next, the mask materials 58 are removed by, for example, an ashing method (FIG. 28).

Figure 29:
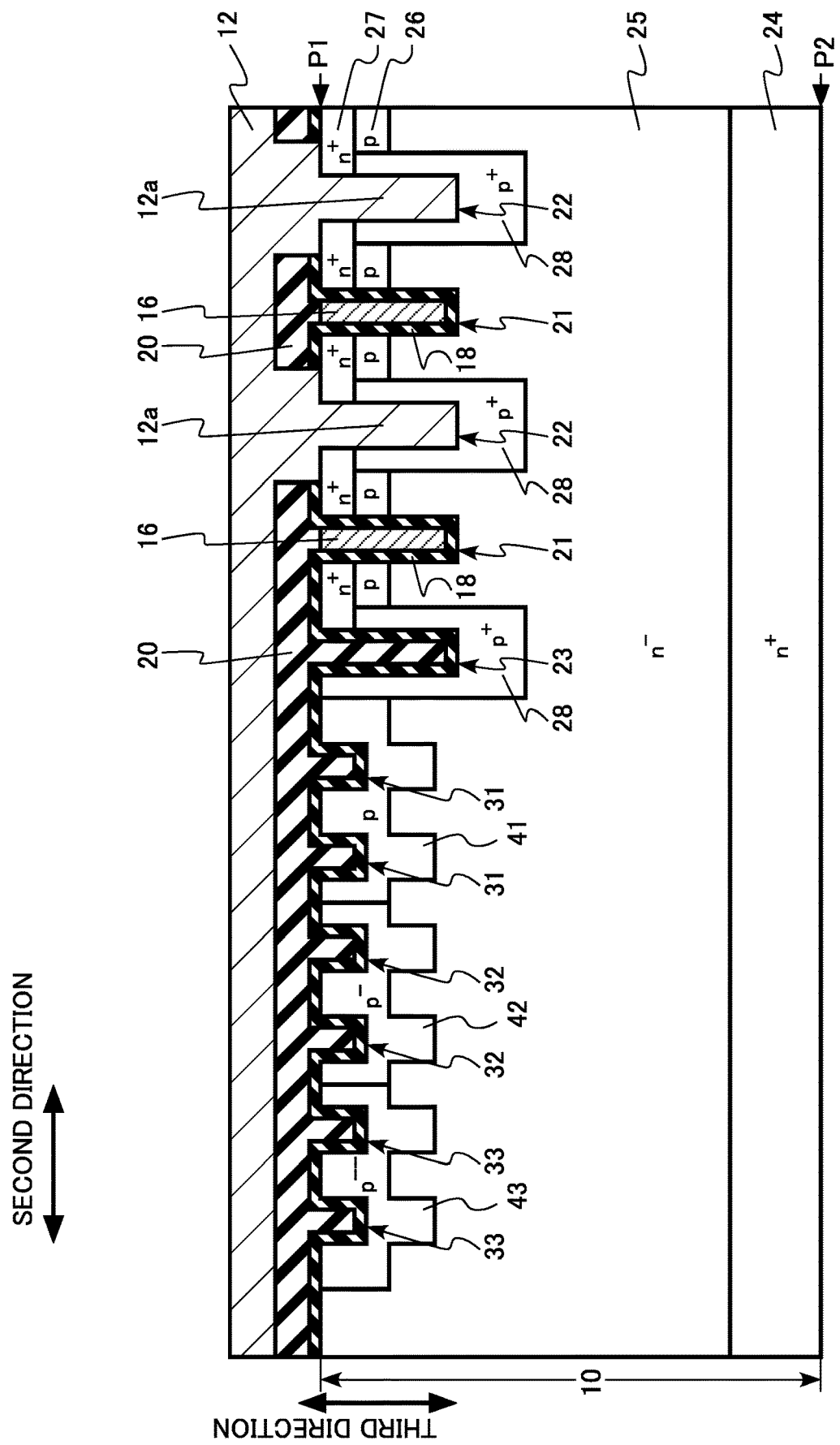
FIG. 29 is a schematic sectional view showing the example of the method of manufacturing the semiconductor device according to the first embodiment.

Next, the source electrode 12 is formed in the contact trenches 22 and on the interlayer insulating layers 20 (FIG. 29). The source electrode 12 is formed by, for example, deposition of a metal film by the CVD method.

After that, the drain electrode 14 is formed on the back face of the silicon carbide layer 10 by using a known process technique.

The MOSFET 100 shown in FIGS. 1 to 3 is manufactured by the above manufacturing method.

Next, the function and effect of the semiconductor device and the method of manufacturing the semiconductor device according to the first embodiment will be described.

The MOSFET 100 adopts a trench gate structure in which the gate electrodes 16 are provided in the gate trenches 21. By applying the trench gate structure, the channel area per unit area is increased and the on-resistance of the MOSFET 100 is reduced.

Further, in the MOSFET 100, the first contact region 12a that is a part of the source electrode 12 is provided in the contact trench 22. The MOSFET 100 is a MOSFET having a so-called double trench structure.

The first contact regions 12a are provided in the contact trenches 22, which enables electrical connection to the body region 26 and the source region 27 on the side faces of the contact trenches 22. Therefore, the connection area of the source electrode 12 on the front face of the silicon carbide layer 10 can be reduced. Therefore, the channel area per unit area is increased and the on-resistance of the MOSFET 100 is reduced.

Further, the MOSFET 100 includes the electric field relaxation regions 28 around the bottom face and the side faces of the contact trenches 22. Therefore, when the MOSFET 100 is turned off, the electric fields applied to the gate insulating layers 18 are relaxed. Therefore, the reliability of the gate insulating layers 18 is improved.

Figure 30:
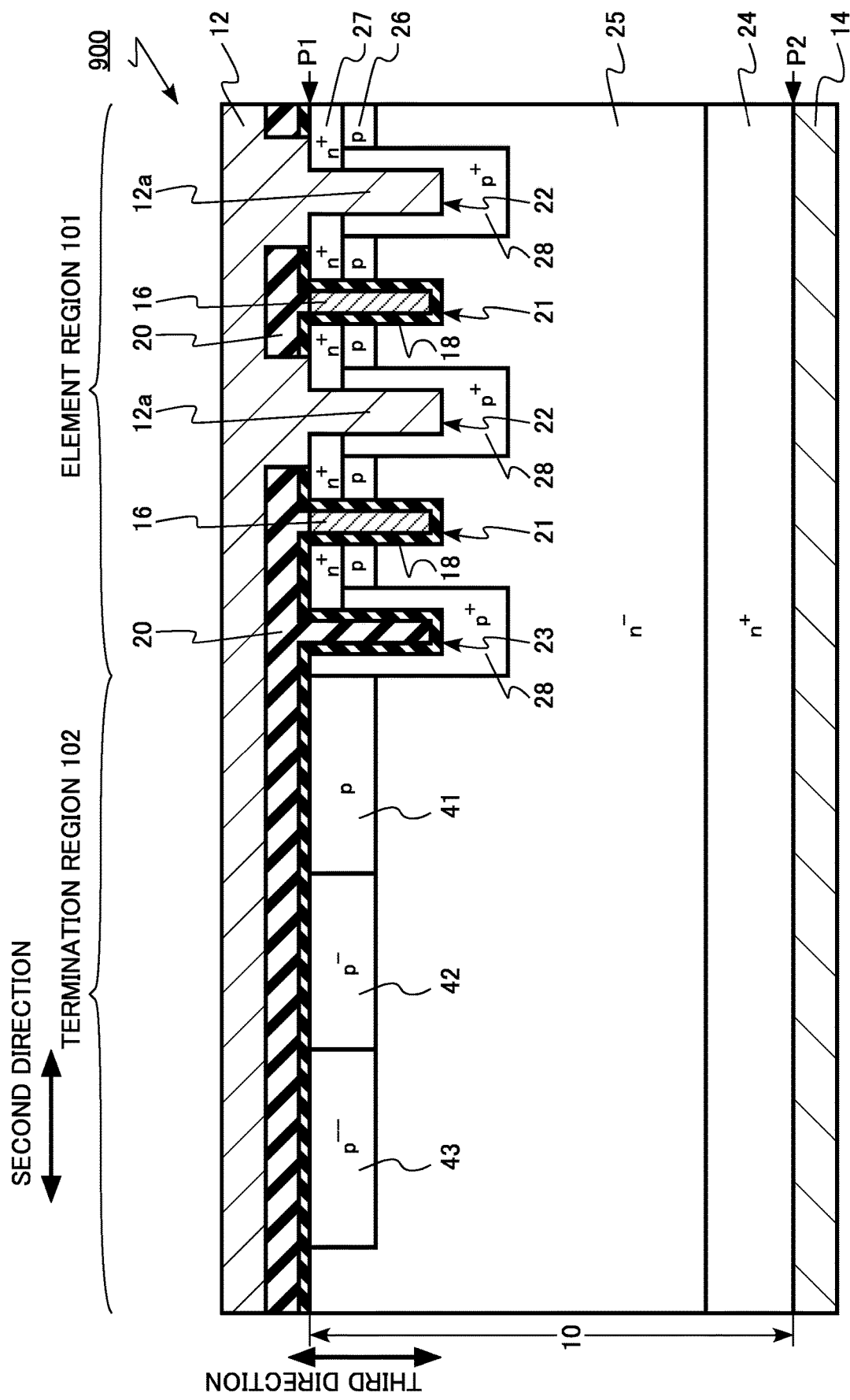
FIG. 30 is an enlarged schematic sectional view of a semiconductor device of a comparative example.

FIG. 30 is an enlarged schematic sectional view of a semiconductor device of a comparative example. The semiconductor device of the comparative example is a MOSFET 900 having a double trench structure.

The MOSFET 900 of the comparative example differs from the MOSFET 100 of the first embodiment in that the termination region 102 does not include the first termination trenches 31, the second termination trenches 32, and the third termination trenches 33.

In the MOSFET 900, deep electric field relaxation regions 28 are present at the ends of an element region 101. The electric fields may be concentrated in the electric field relaxation regions 28 at the ends of the element region 101, and the breakdown voltage of the MOSFET 900 may be reduced.

In the MOSFET 100 of the first embodiment, the termination region 102 includes first termination trenches 31, the second termination trenches 32, and the third termination trenches 33. Then, using the first termination trenches 31, the second termination trenches 32, and the third termination trenches 33, the first p-type region 41, the second p-type region 42, and the third p-type region 43 are formed.

Therefore, the first p-type region 41, the second p-type region 42, and the third p-type region 43 at the bottoms of the first termination trenches 31, the second termination trenches 32, and the third termination trenches 33 are deeply formed. Using the first termination trenches 31, the second termination trenches 32, and the third termination trenches 33, the first p-type region 41, the second p-type region 42, and the third p-type region 43 are formed, so that the deep first p-type region 41, second p-type region 42, and third p-type region 43 can be easily formed.

The depths of the first p-type region 41, the second p-type region 42, and the third p-type region 43 in the MOSFET 100 are larger than those in the MOSFET 900. Therefore, the electric field concentration in the electric field relaxation regions 28 at the ends of the element region 101 is suppressed. Therefore, the breakdown voltage of the MOSFET 100 is improved.

The depths of the first p-type region 41, the second p-type region 42, and the third p-type region 43 are the same as or smaller than the depth of the electric field relaxation regions 28. When the depths of the first p-type region 41, the second p-type region 42, and the third p-type region 43 are larger than the depth of the electric field relaxation regions 28, the electric field concentration in the termination region 102 becomes stronger, and the breakdown voltage of the MOSFET 100 is reduced, which is not preferable.

From the viewpoint of making the depths of the first p-type region 41, the second p-type region 42, and the third p-type region 43 the same as or smaller than the depth of the electric field relaxation regions 28, it is preferable that the depths of the first termination trenches 31, the second termination trenches 32, and the third termination trenches 33 be smaller than the depth of the contact trenches 22. From the viewpoint of properly controlling the depths of the first p-type region 41, the second p-type region 42, and the third p-type region 43, and the depth of the electric field relaxation regions 28, it is preferable that the depths of the first termination trenches 31, the second termination trenches 32, and the third termination trenches 33 be half or less of the depth of the contact trenches 22.

It is preferable that the depths of the first p-type region 41, the second p-type region 42, and the third p-type region 43 be larger than the depth of the body region 26. The depths of the first p-type region 41, the second p-type region 42, and the third p-type region 43 are larger than the depth of the body region 26, so that the electric field concentration in the electric field relaxation regions 28 at the ends of the element region 101 is relaxed.

As described above, according to the first embodiment, by providing the first termination trenches 31, the second termination trenches 32, and the third termination trenches 33 in the termination region 102, the MOSFET with improved breakdown voltage can be achieved.

Second Embodiment

A semiconductor device according to a second embodiment is different from the semiconductor device according to the first embodiment in that the distance between the second face and the sixth silicon carbide region is larger than the distance between the second face and the fifth silicon carbide region, and the distance between the second face and the seventh silicon carbide region is larger than the distance between the second face and the sixth silicon carbide region. Hereinafter, a part of the description overlapping with that of the first embodiment will be omitted.

The semiconductor device according to the second embodiment is a vertical MOSFET 200 that uses silicon carbide. The MOSFET 200 is a MOSFET having a trench gate structure. Moreover, the MOSFET 200 is a MOSFET having a double trench structure. Further, the MOSFET 200 is an n-channel MOSFET that uses electrons as carriers.

Figure 31:
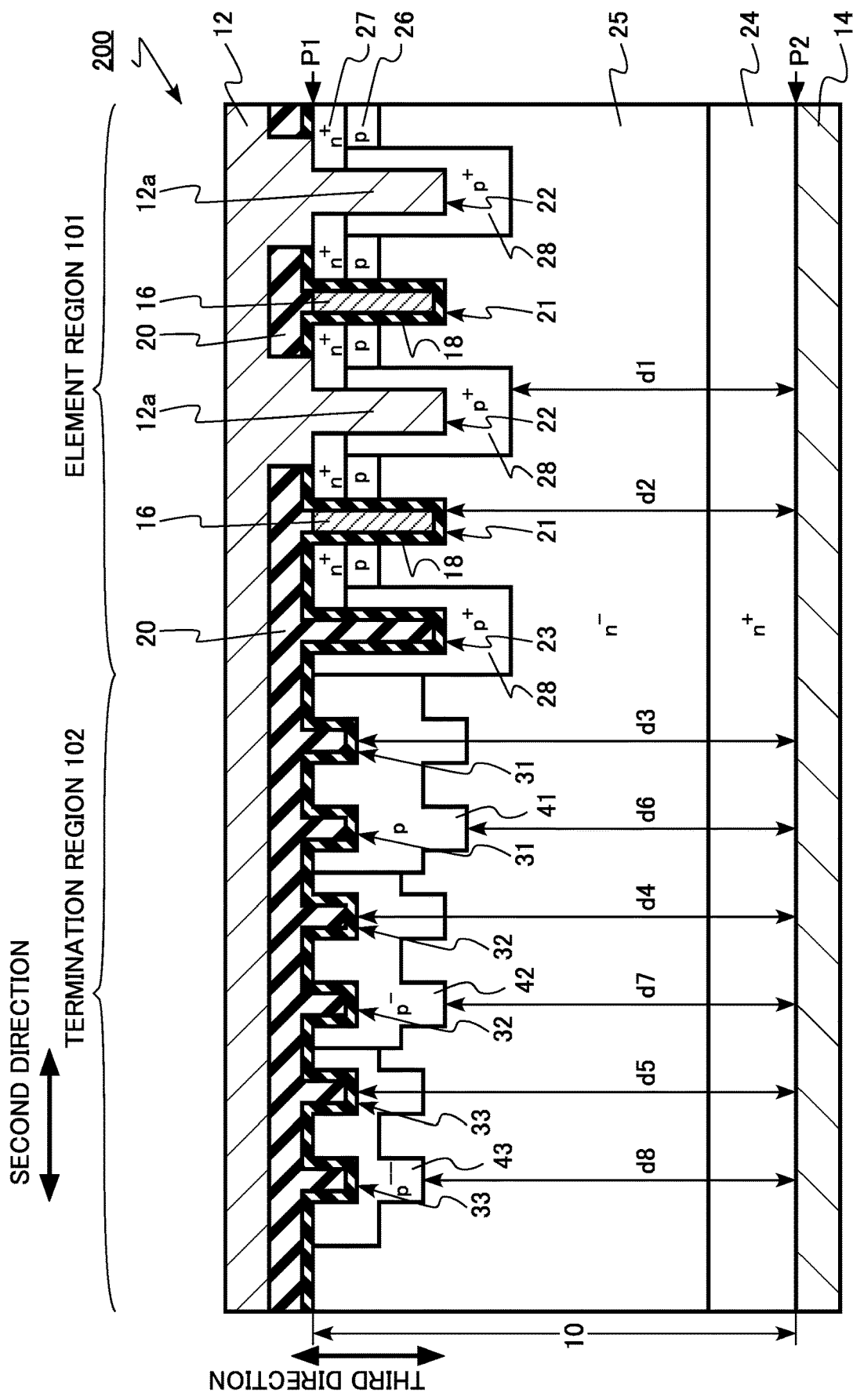
FIG. 31 is an enlarged schematic sectional view of a semiconductor device according to a second embodiment.

FIG. 31 is an enlarged schematic sectional view of the semiconductor device according to the second embodiment. FIG. 31 is a sectional view corresponding to FIG. 2 of the first embodiment.

The MOSFET 200 includes a silicon carbide layer 10, a source electrode 12 (first electrode), a drain electrode (second electrode), gate electrodes 16, gate insulating layers 18, and interlayer insulating layers 20. The source electrode 12 includes first contact regions 12a (other parts).

The silicon carbide layer 10 includes gate trenches 21, contact trenches 22, dummy trenches 23, an n$^+$-type drain region 24, an n$^-$-type drift region 25 (first silicon carbide region), a p-type body region 26 (second Silicon carbide region), an n$^+$-type source region 27 (third silicon carbide region), p$^+$-type electric field relaxation regions 28 (fourth silicon carbide regions), first termination trenches 31 (first trenches), second termination trenches 32 (second trenches), third termination trenches 33 (third trenches), a first p-type region of p-type 41 (fifth silicon carbide region), a second p-type region of p$^-$-type 42 (sixth silicon carbide region), and a third p-type region of p$^{--}$-type 43 (seventh silicon carbide region).

The distance (d7 in FIG. 31) between a second face P2 and the second p-type region 42 is larger than the distance (d6 in FIG. 31) between the second face P2 and the first p-type region 41. Further, the distance (d8 in FIG. 31) between the second face P2 and the third p-type region 43 is larger than the distance (d7 in FIG. 31) between the second face P2 and the second p-type region 42.

In other words, the depth of the second p-type region 42 is smaller than the depth of the first p-type region 41. Further, the depth of the third p-type region 43 is smaller than the depth of the second p-type region 42.

For example, by changing the accelerating voltage of ion implantation at the time of forming the first p-type region 41, the second p-type region 42, and the third p-type region 43, the structure of the termination region 102 of the MOSFET 200 can be formed.

By making the depth of the second p-type region 42 smaller than the depth of the first p-type region 41, and making the depth of the third p-type region 43 smaller than the depth of the second p-type region 42, the electric field concentration in the electric field relaxation regions 28 at the ends of the element region 101 is further alleviated. Therefore, the breakdown voltage of the MOSFET 200 is further improved.

As described above, according to the second embodiment, by providing the first termination trenches 31, the second termination trenches 32, and the third termination trenches 33 in the termination region 102, the MOSFET with improved breakdown voltage can be achieved. Further, by making the depth of the second p-type region 42 smaller than the depth of the first p-type region 41, and making the depth of the third p-type region 43 smaller than the depth of the second p-type region 42, the MOSFET with further improved breakdown voltage can be achieved.

Third Embodiment

A semiconductor device according to a third embodiment is different from the semiconductor devices according to the first embodiment and the second embodiment in that the distance between the second face and the second trench is larger than the distance between the second face and the first trench, and the distance between the second face and the third trench is larger than the distance between the second face and the second trench. Hereinafter, a part of the description overlapping with those of the first embodiment and the second embodiment will be omitted.

The semiconductor device according to the third embodiment is a vertical MOSFET 300 that uses silicon carbide. The MOSFET 300 is a MOSFET having a trench gate structure. Moreover, the MOSFET 300 is a MOSFET having a double trench structure. Further, the MOSFET 300 is an re-channel MOSFET that uses electrons as carriers.

Figure 32:
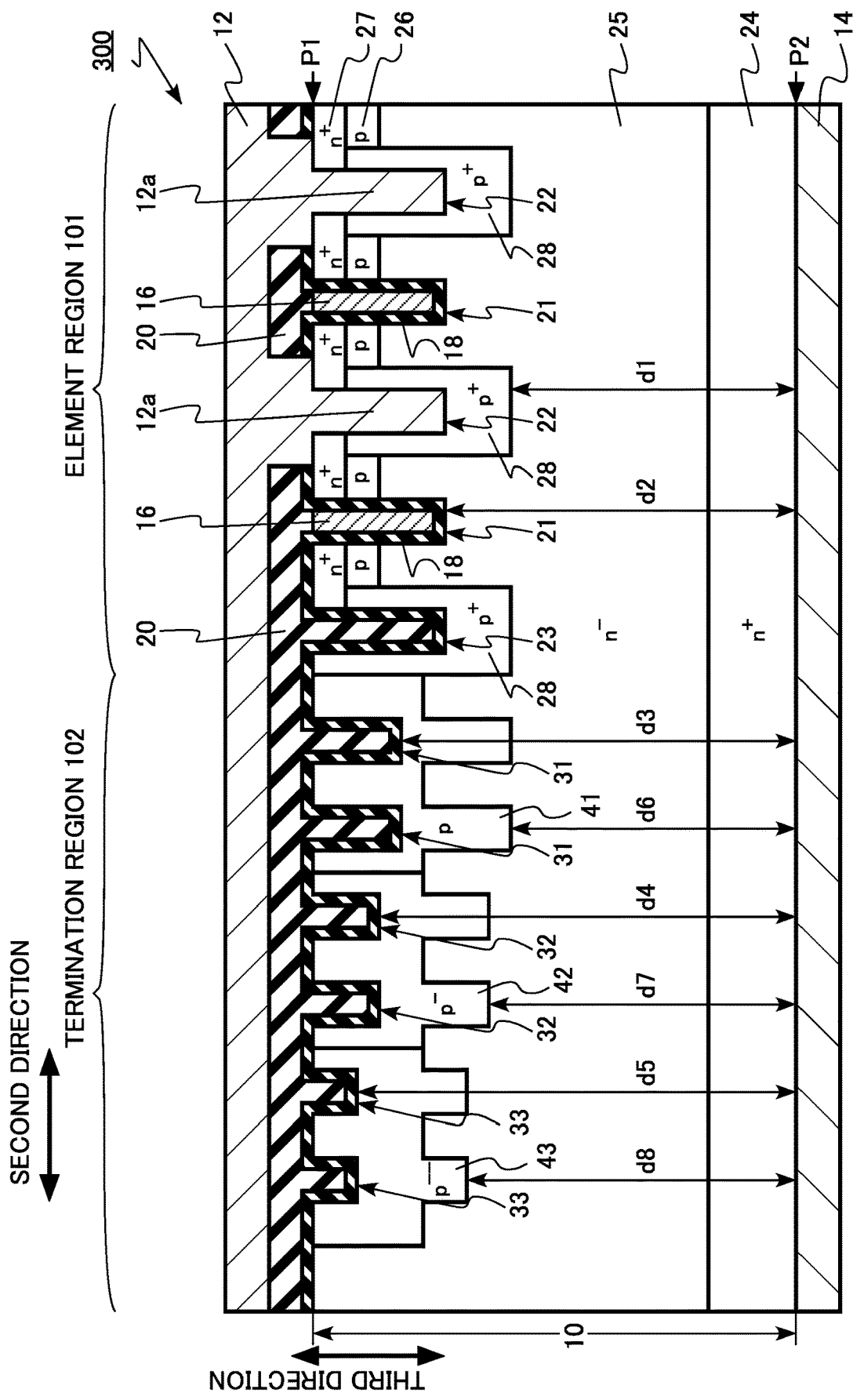
FIG. 32 is an enlarged schematic sectional view of a semiconductor device according to a third embodiment.

FIG. 32 is an enlarged schematic sectional view of the semiconductor device of the third embodiment. FIG. 32 is a sectional view corresponding to FIG. 2 of the first embodiment.

The MOSFET 300 includes a silicon carbide layer 10, a source electrode 12 (first electrode), a drain electrode 14 (second electrode), gate electrodes 16, gate insulating layers 18, and interlayer insulating layers 20. The source electrode 12 includes first contact regions 12a (other parts).

The silicon carbide layer 10 includes gate trenches 21, contact trenches 22, dummy trenches 23, an n$^+$-type drain region 24, an n$^-$-type drift region 25 (first silicon carbide region), a p-type body region 26 (second Silicon carbide region), an n$^+$-type source region 27 (third silicon carbide region), p$^+$-type electric field relaxation regions 28 (fourth silicon carbide regions), first termination trenches 31 (first trenches), second termination trenches 32 (second trenches), third termination trenches 33 (third trenches), a first p-type region of p-type 41 (fifth silicon carbide region), a second p-type region of p$^-$-type 42 (sixth silicon carbide region), and a third p-type region of p$^{--}$-type 43 (seventh silicon carbide region).

The distance (d4 in FIG. 32) between a second face P2 and the second termination trench 32 is larger than the distance (d3 in FIG. 32) between the second face P2 and the first termination trench 31. Further, the distance (d5 in FIG. 32) between the second face P2 and the third termination trench 33 is larger than the distance (d4 in FIG. 32) between the second face P2 and the second termination trench 32.

In other words, the depth of the second termination trench 32 is smaller than the depth of the first termination trench 31.

Further, the depth of the third termination trench 33 is smaller than the depth of the second termination trench 32.

For example, by separately forming the first termination trenches 31, the second termination trenches 32, and the third termination trenches 33 with different etching amounts, the depths of the first termination trenches 31, the second termination trenches 32, and the third termination trenches 33 can be changed.

The distance (d7 in FIG. 32) between a second face P2 and the second p-type region 42 is larger than the distance (d6 in FIG. 32) between the second face P2 and the first p-type region 41. Further, the distance (d8 in FIG. 32) between the second face P2 and the third p-type region 43 is larger than the distance (d7 in FIG. 32) between the second face P2 and the second p-type region 42.

In other words, the depth of the second p-type region 42 is smaller than the depth of the first p-type region 41. Further, the depth of the third p-type region 43 is smaller than the depth of the second p-type region 42.

The depths of the first termination trenches 31, the second termination trenches 32, and the third termination trenches 33 are different, so that the depths of the first p-type region 41, the second p-type region 42, and the third p-type region 43 can be changed.

By making the depth of the second termination trenches 32 smaller than the depth of the first termination trenches 31, the depth of the second p-type region 42 can be easily made smaller than the depth of the first p-type region 41. Further, by making the depth of the third termination trenches 33 smaller than the depth of the second termination trenches 32, the depth of the third p-type region 43 can be easily made smaller than the depth of the second p-type region 42.

By making the depth of the second p-type region 42 smaller than the depth of the first p-type region 41, and making the depth of the third p-type region 43 smaller than the depth of the second p-type region 42, the electric field concentration in the electric field relaxation regions 28 at the ends of the element region 101 is further alleviated. Therefore, the breakdown voltage of the MOSFET 300 is further improved.

As described above, according to the third embodiment, by providing the first termination trenches 31, the second termination trenches 32, and the third termination trenches 33 in the termination region 102, the MOSFET with improved breakdown voltage can be achieved. Further, the depth of the second p-type region 42 can be easily made smaller than the depth of the first p-type region 41, and the depth of the third p-type region 43 can be easily made smaller than the depth of the second p-type region 42, so that the MOSFET with further improved breakdown voltage can be easily achieved.

Fourth Embodiment

A semiconductor device according to a fourth embodiment is different from the semiconductor device according to the first embodiment in that the seventh silicon carbide region includes a first region and second region, the first region disposed between the first silicon carbide region and the third trench, the second region is separated from the first region, and a distance between the second face and the second region is larger than a distance between the second face and the third trench. Hereinafter, a part of the description overlapping with that of the first embodiment will be omitted.

The semiconductor device according to the fourth embodiment is a vertical MOSFET 400 that uses silicon carbide. The MOSFET 400 is a MOSFET having a trench gate structure. Moreover, the MOSFET 400 is a MOSFET having a double trench structure. Further, the MOSFET 400 is an re-channel MOSFET that uses electrons as carriers.

Figure 33:
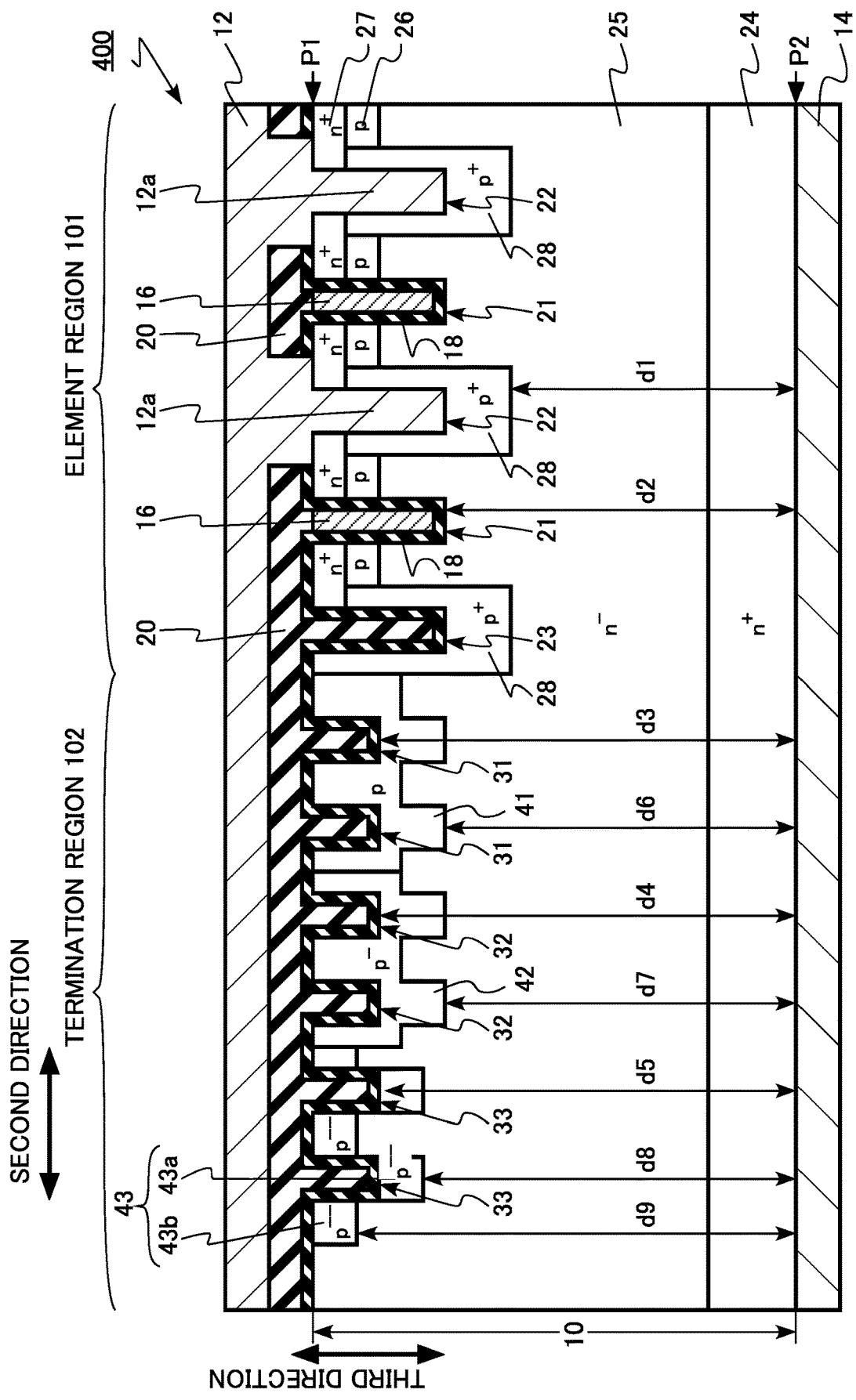
FIG. 33 is an enlarged schematic sectional view of a semiconductor device according to a fourth embodiment.

FIG. 33 is an enlarged schematic sectional view of the semiconductor device of the fourth embodiment. FIG. 33 is a sectional view corresponding to FIG. 2 of the first embodiment.

The MOSFET 400 includes a silicon carbide layer 10, a source electrode 12 (first electrode), a drain electrode (second electrode), gate electrodes 16, gate insulating layers 18, and interlayer insulating layers 20. The source electrode 12 includes first contact regions 12$a$ (other parts).

The silicon carbide layer 10 includes gate trenches 21, contact trenches 22, dummy trenches 23, an n$^+$-type drain region 24, an n$^-$-type drift region 25 (first silicon carbide region), a p-type body region 26 (second Silicon carbide region), an n$^+$-type source region 27 (third silicon carbide region), p$^+$-type electric field relaxation regions 28 (fourth silicon carbide regions), first termination trenches 31 (first trenches), second termination trenches 32 (second trenches), third termination trenches 33 (third trenches), a first p-type region of p-type 41 (fifth silicon carbide region), a second p-type region of p$^-$-type 42 (sixth silicon carbide region), and a third p-type region of p$^{--}$-type 43 (seventh silicon carbide region). The third p-type region 43 includes a first region 43$a$ and a second region 43$b$.

The first region 43$a$ is provided between the drift region 25 and the third termination trench 33. The first region 43$a$ is electrically isolated from the source electrode 12. The electric potential of the first region 43$a$ is floating.

The second region 43$b$ is provided between the drift region 25 and the first face P1. The second region 43$b$ is separated from the first region 43$a$. The second region 43$b$ is electrically separated from the source electrode 12, for example. The electric potential of the second region 43$b$ is floating.

The distance (d9 in FIG. 33) between the second face P2 and the second region 43$b$ is larger than the distance (d5 in FIG. 33) between the second face P2 and the third termination trench 33. In other words, the depth of the second region 43$b$ is smaller than the depth of the third termination trench 33.

For example, the accelerating voltage of ion implantation at the time of forming the third p-type region 43 is made smaller than the accelerating voltage of ion implantation at the time of forming the first p-type region 41 and the second p-type region 42, the first region 43$a$ and the second region 43$b$ can be formed.

By providing the first region 43$a$ in which the electric potential is floating, the electric field concentration in the electric field relaxation regions 28 at the ends of the element region 101 is further relaxed. Therefore, the breakdown voltage of the MOSFET 400 is further improved. By further providing the second region 43$b$ in which the electric potential is floating, the electric field concentration in the electric field relaxation regions 28 at the ends of the element region 101 is further relaxed.

As described above, according to the fourth embodiment, by providing the first termination trenches 31, the second termination trenches 32, and the third termination trenches 33 in the termination region 102, the MOSFET with improved breakdown voltage can be achieved. Further, since the third p-type region 43 includes the first region 43$a$ and the second region 43$b$ whose electric potential is floating, the MOSFET with further improved breakdown voltage can be achieved.

Fifth Embodiment

A semiconductor device according to a fifth embodiment is different from the semiconductor device according to the first embodiment in that a part of the first electrode is disposed in the first trench, and a part of the first electrode is in contact with the fifth silicon carbide region. Hereinafter, a part of the description overlapping with that of the first embodiment will be omitted.

The semiconductor device according to the fifth embodiment is a vertical MOSFET 500 that uses silicon carbide. The MOSFET 500 is a MOSFET having a trench gate structure. Moreover, the MOSFET 500 is a MOSFET having a double trench structure. Further, the MOSFET 500 is an re-channel MOSFET that uses electrons as carriers.

Figure 34:
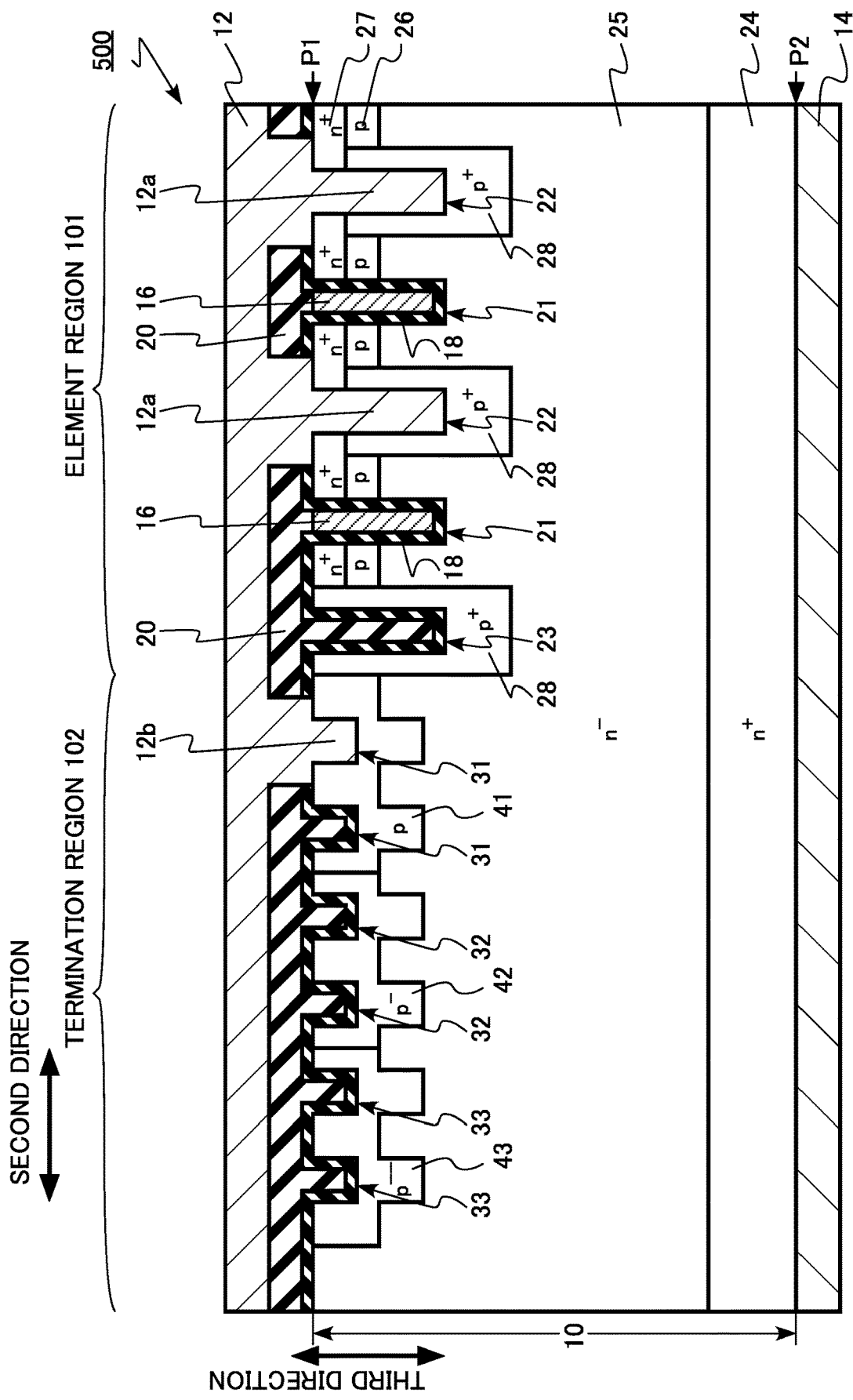
FIG. 34 is an enlarged schematic sectional view of a semiconductor device according to a fifth embodiment.

FIG. 34 is an enlarged schematic sectional view of the semiconductor device according to the fifth embodiment. FIG. 34 is a sectional view corresponding to FIG. 2 of the first embodiment.

The MOSFET 500 includes a silicon carbide layer 10, a source electrode 12 (first electrode), a drain electrode 14 (second electrode), gate electrodes 16, gate insulating layers 18, and interlayer insulating layers 20. The source electrode 12 includes first contact regions 12a (other parts) and a second contact region 12b (part).

The silicon carbide layer 10 includes gate trenches 21, contact trenches 22, dummy trenches 23, an $n^+$-type drain region 24, an $n^-$-type drift region 25 (first silicon carbide region), a p-type body region 26 (second Silicon carbide region), an $n^+$-type source region 27 (third silicon carbide region), $p^+$-type electric field relaxation regions 28 (fourth silicon carbide regions), first termination trenches 31 (first trenches), second termination trenches 32 (second trenches), third termination trenches 33 (third trenches), a first p-type region of p-type 41 (fifth silicon carbide region), a second p-type region of $p^-$-type 42 (sixth silicon carbide region), and a third p-type region of $p^{--}$-type 43 (seventh silicon carbide region).

The second contact region 12b, which is a part of the source electrode 12, is provided in the first termination trench 31. The second contact region 12b is in contact with the p-type region 41 in the first termination trench 31.

The p-type region 41 is electrically connected to the source electrode 12 by the second contact region 12b.

Since the p-type region 41 is electrically connected to the source electrode 12 by the second contact region 12b, the electric potential of the p-type region 41 becomes stable. Therefore, the breakdown voltage of the MOSFET 500 becomes stable.

Further, since the p-type region 41 is electrically connected to the source electrode 12 by the second contact region 12b, the hole extraction efficiency is improved when avalanche breakdown occurs in the termination region 102. Therefore, the avalanche resistance of the MOSFET 500 is improved.

As described above, according to the fifth embodiment, by providing the first termination trenches 31, the second termination trenches 32, and the third termination trenches 33 in the termination region 102, the MOSFET with improved breakdown voltage can be achieved. Further, since the p-type region 41 is in contact with the second contact region 12b, the breakdown voltage of the MOSFET becomes stable and the avalanche resistance of the MOSFET is improved.

Sixth Embodiment

A semiconductor device according to a sixth embodiment is different from the semiconductor device according to the first embodiment in that a first silicon carbide region in an element region includes a first portion and a second portion disposed between the first portion and a first face, and the n-type impurity concentration of the second portion is higher than the n-type impurity concentration of the first portion. Hereinafter, a part of the description overlapping with that of the first embodiment will be omitted.

The semiconductor device according to the sixth embodiment is a vertical MOSFET 600 that uses silicon carbide. The MOSFET 600 is a MOSFET having a trench gate structure. Moreover, the MOSFET 600 is a MOSFET having a double trench structure. Further, the MOSFET 600 is an re-channel MOSFET that uses electrons as carriers.

Figure 35:
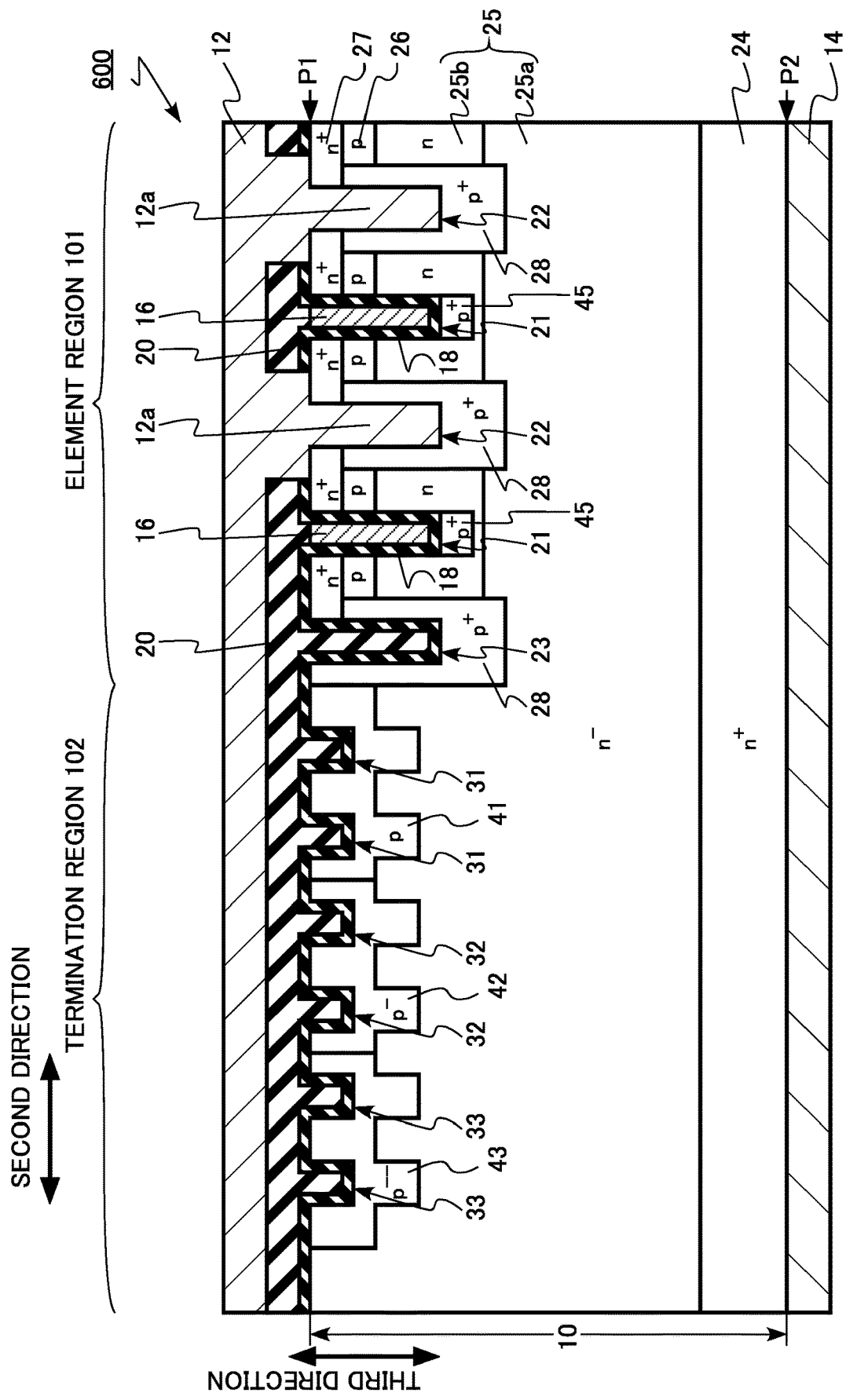
FIG. 35 is an enlarged schematic sectional view of a semiconductor device according to a sixth embodiment.

FIG. 35 is an enlarged schematic sectional view of the semiconductor device according to the sixth embodiment. FIG. 35 is a sectional view corresponding to FIG. 2 of the first embodiment.

The MOSFET 600 includes a silicon carbide layer 10, a source electrode 12 (first electrode), a drain electrode 14 (second electrode), gate electrodes 16, gate insulating layers 18, and interlayer insulating layers 20. The source electrode 12 includes first contact regions 12a (other parts).

The silicon carbide layer 10 includes gate trenches 21, contact trenches 22, dummy trenches 23, an $n^+$-type drain region 24, an $n^-$-type drift region 25 (first silicon carbide region), a p-type body region 26 (second Silicon carbide region), an $n^+$-type source region 27 (third silicon carbide region), $p^+$-type electric field relaxation regions 28 (fourth silicon carbide regions), first termination trenches 31 (first trenches), second termination trenches 32 (second trenches), third termination trenches 33 (third trenches), a first p-type region of p-type 41 (fifth silicon carbide region), a second p-type region of $p^-$-type 42 (sixth silicon carbide region), a third p-type region of $p^{--}$-type 43 (seventh silicon carbide region), and $p^+$-type trench bottom regions 45 (eighth silicon carbide regions). The drift region 25 includes a low-concentration region 25a (first portion) and a high-concentration region 25b (second portion).

The $p^+$-type trench bottom region 45 is provided between the drift region 25 and the gate trench 21. With the $p^+$-type trench bottom regions 45, the electric fields applied to the gate insulating layers 18 are further relaxed when the MOSFET 600 is turned off. Therefore, the reliability of the gate insulating layers 18 is further improved.

The drift region 25 in the element region 101 includes the low-concentration region 25a and the high-concentration region 25b. The n-type impurity concentration of the high-concentration region 25b is higher than the n-type impurity concentration of the low-concentration region 25a. By providing the high-concentration region 25b, the on-resistance of the MOSFET 600 is reduced.

The depth of the high-concentration region 25b is larger than the depth of the gate trench 21, for example.

The high-concentration region 25b is not provided in the termination region 102. By not providing the high-concentration region 25b in the termination region 102, the electric field concentration in the electric field relaxation regions 28 at the ends of the element region 101 is suppressed. Therefore, the breakdown voltage of the MOSFET 600 is further improved.

As described above, according to the sixth embodiment, by providing the first termination trenches 31, the second termination trenches 32, and the third termination trenches 33 in the termination region 102, the MOSFET with improved breakdown voltage can be achieved. Further, by providing the trench bottom regions 45, the reliability of the gate insulating layers 18 is further improved. Further, by providing the high-concentration region 25b, the on-resistance of the MOSFET is reduced.

Seventh Embodiment

An inverter circuit and a drive device according to a seventh embodiment are a drive device including the semiconductor device according to the first embodiment.

Figure 36:
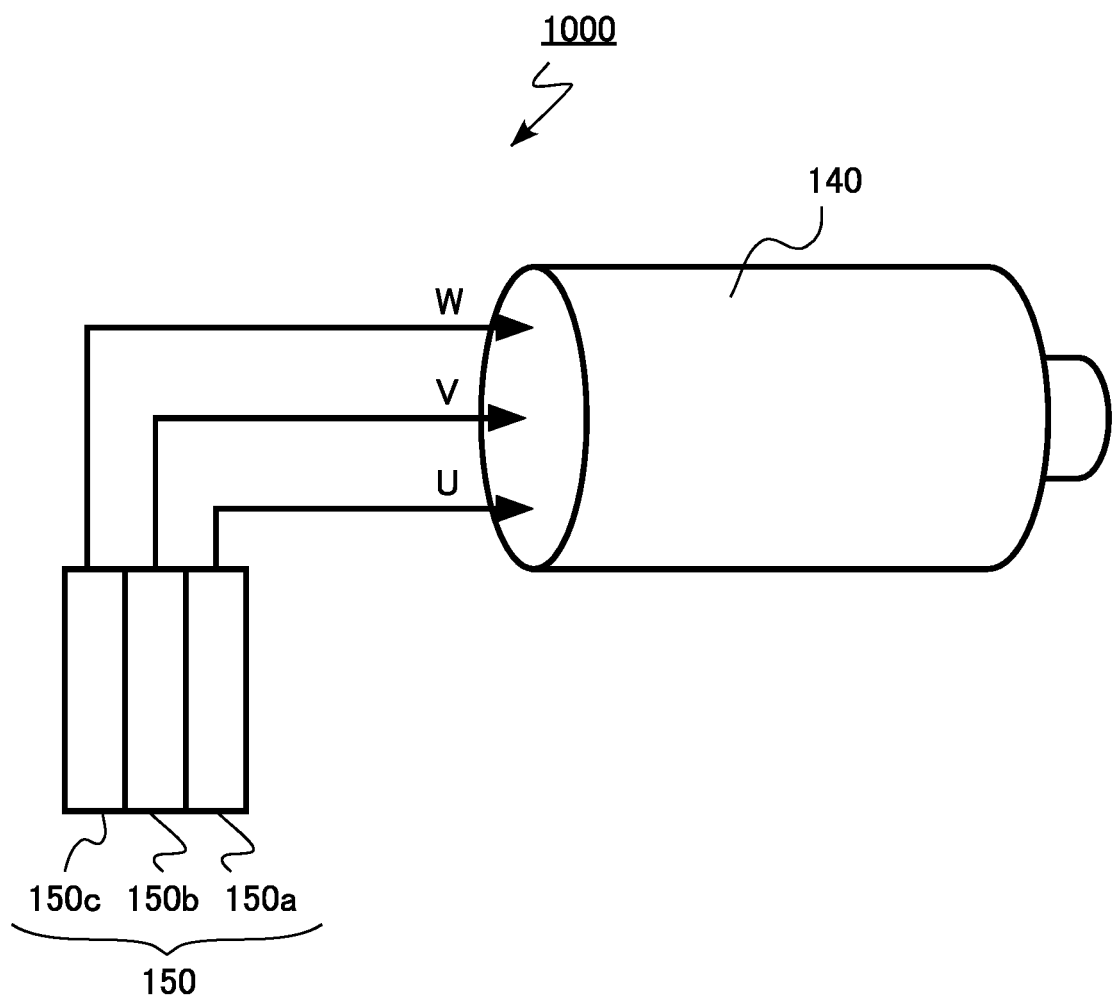
FIG. 36 is a schematic view of a drive device according to a seventh embodiment.

FIG. 36 is a schematic view of the drive device according to the seventh embodiment. A drive device 1000 includes a motor 140 and an inverter circuit 150.

The inverter circuit 150 includes three semiconductor modules 150a, 150b, and 150c that use the MOSFET 100 of the first embodiment as a switching element. By connecting the three semiconductor modules 150a, 150b, and 150c in parallel, the three-phase inverter circuit 150 including three AC voltage output terminals U, V, and W is achieved. The motor 140 is driven by the AC voltage output from the inverter circuit 150.

According to the seventh embodiment, by including the MOSFET 100 having improved characteristics, the characteristics of the inverter circuit 150 and the drive device 1000 are improved.

Eighth Embodiment

A vehicle according to an eighth embodiment is a vehicle including the semiconductor device according to the first embodiment.

Figure 37:
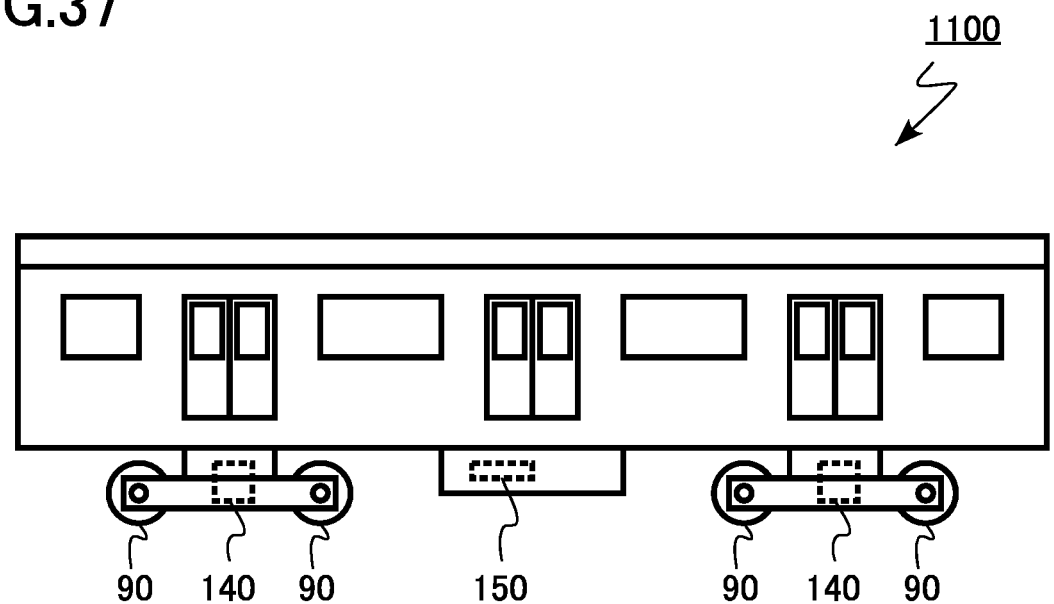
FIG. 37 is a schematic view of a vehicle according to an eighth embodiment.

FIG. 37 is a schematic view of the vehicle according to the eighth embodiment. A vehicle 1100 according to the eighth embodiment is a railway vehicle. The vehicle 1100 includes a motor 140 and an inverter circuit 150.

The inverter circuit 150 includes three semiconductor modules that use the MOSFET 100 of the first embodiment as a switching element. By connecting the three semiconductor modules in parallel, the three-phase inverter circuit 150 including the three AC voltage output terminals U, V, and W is achieved. The motor 140 is driven by the AC voltage output from the inverter circuit 150. Wheels 90 of the vehicle 1100 are rotated by the motor 140.

According to the eighth embodiment, by including the MOSFET 100 having improved characteristics, the characteristics of the vehicle 1100 are improved.

Ninth Embodiment

A vehicle according to a ninth embodiment is a vehicle including the semiconductor device according to the first embodiment.

Figure 38:
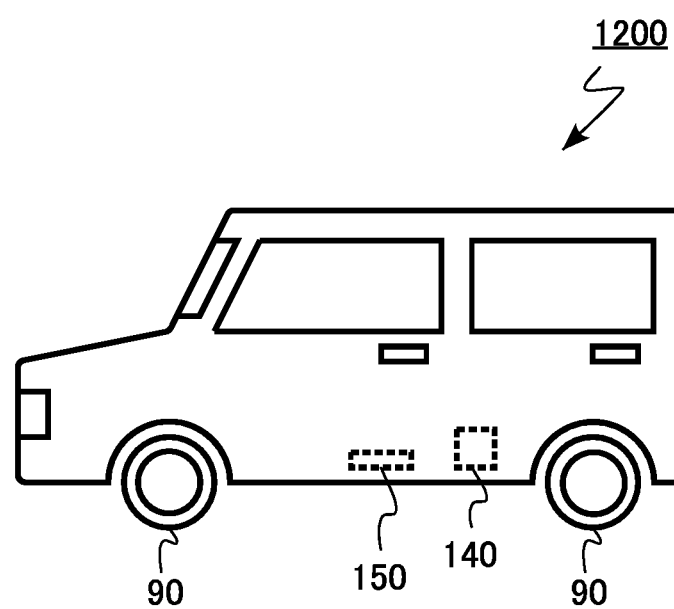
FIG. 38 is a schematic view of a vehicle according to a ninth embodiment.

FIG. 38 is a schematic view of the vehicle according to the ninth embodiment. A vehicle 1200 according to the ninth embodiment is an automobile. The vehicle 1200 includes a motor 140 and an inverter circuit 150.

The inverter circuit 150 includes three semiconductor modules that use the MOSFET 100 of the first embodiment as a switching element. By connecting the three semiconductor modules in parallel, the three-phase inverter circuit 150 including the three AC voltage output terminals U, V, and W is achieved.

The motor 140 is driven by the AC voltage output from the inverter circuit 150. Wheels 90 of the vehicle 1200 are rotated by the motor 140.

According to the ninth embodiment, by including the MOSFET 100 having improved characteristics, the characteristics of the vehicle 1200 are improved.

Tenth Embodiment

An elevating machine according to a tenth embodiment is an elevating machine including the semiconductor device according to the first embodiment.

Figure 39:
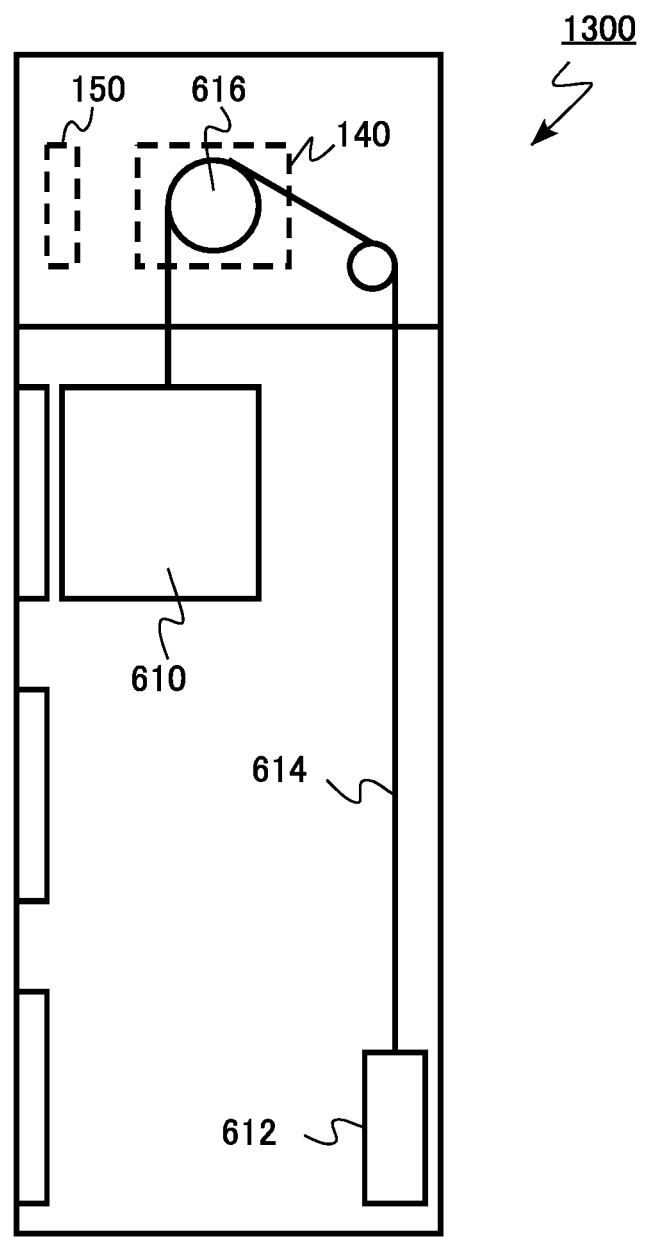
FIG. 39 is a schematic view of an elevating machine according to a tenth embodiment.

FIG. 39 is a schematic view of an elevating machine (elevator) according to the tenth embodiment. An elevating machine 1300 according to the tenth embodiment includes a car 610, a counterweight 612, a wire rope 614, a hoisting machine 616, a motor 140, and an inverter circuit 150.

The inverter circuit 150 includes three semiconductor modules that use the MOSFET 100 of the first embodiment as a switching element. By connecting the three semiconductor modules in parallel, the three-phase inverter circuit 150 including the three AC voltage output terminals U, V, and W is achieved.

The motor 140 is driven by the AC voltage output from the inverter circuit 150. The motor 140 rotates the hoisting machine 616 to raise and lower the car 610.

According to the tenth embodiment, by including the MOSFET 100 having improved characteristics, the characteristics of the elevating machine 1300 are improved.

As described above, in the first to sixth embodiments, the case where 4H-SiC is used as the crystal structure of silicon carbide has been described as an example. However, the present disclosure is also applicable to silicon carbide having another crystal structure such as 6H-SiC, 3C-SiC, or the like.

In the first to sixth embodiments, the semiconductor device including the contact trenches 22 and the dummy trenches 23 has been described, but a semiconductor device including no contact trenches 22 and dummy trenches 23 is also possible.

In the first to sixth embodiments, the case where the number of each of the first termination trenches 31, the second termination trenches 32, and the third termination trenches 33 is two has been described as an example. However, the number of each of the first termination trenches 31, the second termination trenches 32, and the third termination trenches 33 may be one or three or more. The numbers of the first termination trenches 31, the second termination trenches 32, and the third termination trenches 33 may be different from each other.

In the first to sixth embodiments, the case where the number of p-type regions in the termination region 102 is three has been described as an example, but the number of p-type regions in the termination region 102 may be one, two, or four or more.

In the first to sixth embodiments, the case where the gate trenches 21, the contact trenches 22, and the dummy trenches 23 have a stripe shape has been described as an example. However, the gate trenches 21, the contact trenches 22, and the dummy trenches 23 are not limited to the stripe shape, and may have other shapes such as a columnar shape, a polygonal shape, and a honeycomb shape.

In the sixth embodiment, the case where the high-concentration region 25b is not provided in the termination region 102 has been described as an example, but the high-concentration region 25b may be provided in the termination region 102.

Further, in the seventh to tenth embodiments, the case where the semiconductor device according to the first embodiment is provided has been described as an example, but the semiconductor devices of the second to sixth embodiments may be adopted.

Further, in the seventh to tenth embodiments, the case where the semiconductor device of the present disclosure is applied to a vehicle or an elevator is described as an example, but the semiconductor device of the present disclosure is applicable to, for example, a power conditioner of a solar power generation system or the like.

While certain embodiments have been described, these embodiments have been presented by way of example only, and are not intended to limit the scope of the inventions. Indeed, the semiconductor device, the inverter circuit, the drive device, the vehicle, and the elevating machine described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer having a first face and a second face,
the silicon carbide layer including an element region and a termination region surrounding the element region,
the element region including:
a gate trench disposed on a side of the first face;
a first silicon carbide region of n-type;
a second silicon carbide region of p-type disposed between the first silicon carbide region and the first face;
a third silicon carbide region of n-type disposed between the second silicon carbide region and the first face; and
a fourth silicon carbide region of p-type, the first silicon carbide region interposed between the fourth silicon carbide region and the gate trench, the second silicon carbide region interposed between the fourth silicon carbide region and the gate trench, a distance between the second face and the fourth silicon carbide region being smaller than a distance between the second face and the gate trench,
the termination region including:
a first trench disposed on the side of the first face and surrounding the element region;
the first silicon carbide region; and
a fifth silicon carbide region of p-type, at least a part of the fifth silicon carbide region being disposed between the first silicon carbide region and the first trench, a distance between the second face and the fifth silicon carbide region being the same as or larger than the distance between the second face and the fourth silicon carbide region, and the fifth silicon carbide region having a p-type impurity concentration lower than a p-type impurity concentration of the fourth silicon carbide region;
a gate electrode disposed in the gate trench;
a gate insulating layer disposed between the gate electrode and the silicon carbide layer;
a first electrode disposed on the side of the first face of the silicon carbide layer and electrically connected to the second silicon carbide region, the third silicon carbide region, the fourth silicon carbide region and the fifth silicon carbide region; and
a second electrode disposed on a side of the second face of the silicon carbide layer.

2. The semiconductor device according to claim 1, wherein the termination region further includes:
a second trench surrounding the first trench; and
a sixth silicon carbide region of p-type, at least a part of the sixth silicon carbide region being disposed between the first silicon carbide region and the second trench, the sixth silicon carbide region being electrically connected to the first electrode, a distance between the second face and the sixth silicon carbide region being the same as or larger than the distance between the second face and the fourth silicon carbide region, and the sixth silicon carbide region having a p-type impurity concentration lower than a p-type impurity concentration of the fifth silicon carbide region.

3. The semiconductor device according to claim 2, wherein the distance between the second face and the sixth silicon carbide region is larger than the distance between the second face and the fifth silicon carbide region.

4. The semiconductor device according to claim 3, wherein a distance between the second face and the second trench is larger than a distance between the second face and the first trench.

5. The semiconductor device according to claim 2, wherein the sixth silicon carbide region and the fifth silicon carbide region are in contact with each other.

6. The semiconductor device according to claim 2, wherein the termination region further includes:
a third trench surrounding the second trench; and
a seventh silicon carbide region of p-type, at least a part of the seventh silicon carbide region being disposed between the first silicon carbide region and the third trench, a distance between the second face and the seventh silicon carbide region being the same as or larger than the distance between the second face and the fourth silicon carbide region, and the seventh silicon carbide region having a p-type impurity concentration lower than the p-type impurity concentration of the sixth silicon carbide region.

7. The semiconductor device according to claim 6, wherein the seventh silicon carbide region is electrically connected to the first electrode.

8. The semiconductor device according to claim 6, wherein the seventh silicon carbide region and the sixth silicon carbide region are in contact with each other.

9. The semiconductor device according to claim 6, wherein the seventh silicon carbide region includes a first region and second region, the first region disposed between the first silicon carbide region and the third trench, the second region is separated from the first region, and a distance between the second face and the second region is larger than a distance between the second face and the third trench.

10. The semiconductor device according to claim 6, wherein a distance between the second face and the seventh silicon carbide region is larger than the distance between the second face and the sixth silicon carbide region.

11. The semiconductor device according to claim 10, wherein a distance between the second face and the third trench is larger than a distance between the second face and the second trench.

12. The semiconductor device according to claim 1, wherein a part of the first electrode is disposed in the first trench, and the part of the first electrode and the fifth silicon carbide region are in contact with each other.

13. The semiconductor device according to claim 1, wherein the element region includes a contact trench disposed on the side of the first face side, the fourth silicon carbide region is interposed between the first silicon carbide region and the contact trench, and a part of the first electrode is disposed in the contact trench.

14. The semiconductor device according to claim 1, wherein the first silicon carbide region in the element region includes a first portion and a second portion disposed between the first portion and the first face, and an n-type impurity concentration of the second portion is higher than an n-type impurity concentration of the first portion.

15. An inverter circuit comprising the semiconductor device according to claim 1.

16. A drive device comprising the semiconductor device according to claim 1.

17. A vehicle comprising the semiconductor device according to claim 1.

18. An elevating machine comprising the semiconductor device according to claim 1.

* * * * *